(12) United States Patent
Kim

(10) Patent No.: US 12,666,651 B2
(45) Date of Patent: Jun. 23, 2026

(54) SEMICONDUCTOR DEVICE HAVING A SEPARATION STRUCTURE

(71) Applicant: SAMSUNG ELECTRONICS CO., LTD., Suwon-si (KR)

(72) Inventor: Sungmin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 343 days.

(21) Appl. No.: 18/491,550

(22) Filed: Oct. 20, 2023

(65) Prior Publication Data

US 2024/0339516 A1 Oct. 10, 2024

(30) Foreign Application Priority Data

Apr. 5, 2023 (KR) ........................ 10-2023-0044735

(51) Int. Cl.
| | |
|---|---|
| *H10D 30/67* | (2025.01) |
| *H10D 30/01* | (2025.01) |
| *H10D 30/43* | (2025.01) |
| *H10D 62/10* | (2025.01) |
| *H10D 64/01* | (2025.01) |

(52) U.S. Cl.
CPC ....... *H10D 30/6735* (2025.01); *H10D 30/014* (2025.01); *H10D 30/43* (2025.01); *H10D 62/121* (2025.01); *H10D 64/01326* (2026.01)

(58) Field of Classification Search
None
See application file for complete search history.

(56) References Cited

U.S. PATENT DOCUMENTS

| | | | |
|---|---|---|---|
| 9,583,362 B2 | 2/2017 | Ho et al. | |
| 11,152,486 B2 | 10/2021 | Ho et al. | |
| 2015/0206963 A1 | 7/2015 | Ho et al. | |
| 2022/0293731 A1 | 9/2022 | Lee et al. | |
| 2022/0359713 A1 | 11/2022 | Lian et al. | |
| 2022/0376087 A1 | 11/2022 | Kuo et al. | |
| 2022/0384439 A1 | 12/2022 | Khaderbad et al. | |
| 2023/0307285 A1* | 9/2023 | Huang | H10D 62/151 |
| 2024/0006535 A1* | 1/2024 | Lin | H10D 30/6215 |
| 2025/0022941 A1* | 1/2025 | Park | H10D 84/83 |

FOREIGN PATENT DOCUMENTS

KR 1667116 B1 10/2016

* cited by examiner

*Primary Examiner* — Nduka E Ojeh
(74) *Attorney, Agent, or Firm* — MORGAN, LEWIS & BOCKIUS LLP

(57) ABSTRACT

A semiconductor device may include: a substrate; a lower pattern extending from the substrate in a first direction; a channel pattern disposed on the lower pattern; a source/drain pattern disposed on sides of the channel pattern; a first gate structure and a second gate structure extending in a second direction intersecting the first direction and surrounding respective portions of the channel pattern; and a separation structure disposed between the first gate structure and the second gate structure, and including a first portion extending in the first direction and a second portion protruding from the first portion toward the channel pattern, wherein the first gate structure includes first and second conductive patterns stacked sequentially from the respective portion of the channel pattern, and a length of the second conductive pattern in the second direction is equal to or greater than a length of the second portion in the second direction.

20 Claims, 24 Drawing Sheets

SEMICONDUCTOR DEVICE HAVING A SEPARATION STRUCTURE

CROSS-REFERENCE TO RELATED APPLICATION

This application claims priority under 35 U.S.C. § 119 to Korean Patent Application No. 10-2023-0044735, filed in the Korean Intellectual Property Office on Apr. 5, 2023, the entire contents of which are herein incorporated by reference.

BACKGROUND

1. Technical Field

The present disclosure relates to a semiconductor device and more particularly to a semiconductor device having a separation structure.

2. Discussion of Related Art

A semiconductor is a material that falls in an intermediate region between a conductor and a nonconductor. A semiconductor material may be capable of conducting electricity under certain conditions. These semiconductor materials may be used to manufacture various semiconductor devices, such as memory devices. These semiconductor devices may be used in a variety of electronic devices.

As the electronics industry becomes more sophisticated, demands on the semiconductor devices are gradually increasing. For example, semiconductor devices may need to be increasingly reliable, fast and/or multifunctional. To meet these needs, structures within semiconductor devices are becoming increasingly complex and integrated. As the size of transistors decreases and the thickness of layers and size of elements decreases, parasitic capacitance may increase, which can reduce the speed of operation of the semiconductor device and degrade the reliability of the semiconductor device.

SUMMARY

The present disclosure has been made in an effort to provide a semiconductor device with improved reliability and a method of manufacturing the same.

An embodiment of a semiconductor device includes: a substrate; a lower pattern extending from the substrate in a first direction; a channel pattern disposed on the lower pattern; a source/drain pattern disposed on sides of the channel pattern; a first gate structure and a second gate structure extending in a second direction intersecting the first direction and surrounding respective portions of the channel pattern; and a separation structure disposed between the first gate structure and the second gate structure, and including a first portion extending in the first direction and a second portion protruding from the first portion toward the channel pattern, in which the first gate structure includes a first conductive pattern and a second conductive pattern stacked sequentially from the respective portion of the channel pattern, and a length of the second conductive pattern in the second direction is equal to or greater than a length of the second portion of the separation structure in the second direction.

Another embodiment provides a semiconductor device, including: a substrate; a lower pattern disposed on the substrate and extending in a first direction; a channel pattern disposed on the lower pattern; a source/drain pattern disposed on sides of the channel pattern; and a first gate structure and a second gate structure extending in a second direction intersecting the first direction and surrounding respective portions of the channel pattern, in which the first gate structure includes a first conductive pattern and a second conductive pattern stacked sequentially from the respective portion of the channel pattern, the second gate structure includes a third conductive pattern and a fourth conductive pattern stacked sequentially from the respective portion of the channel pattern, and a distance between the first conductive pattern and the third conductive pattern is greater than a distance between the second conductive pattern and the fourth conductive pattern.

Still another embodiment provides a semiconductor device, including: a substrate; a lower pattern disposed on the substrate and extending in a first direction; a channel pattern disposed on the lower pattern; a source/drain pattern disposed on sides of the channel pattern; and a first gate structure extending in a second direction intersecting the first direction and surrounding respective portions of the channel pattern, in which the first gate structure includes a first conductive pattern and a second conductive pattern stacked sequentially from the channel pattern, a separation structure interposed within a recess of the first conductive pattern, and at least a portion of the second conductive pattern is surrounded by the separation structure.

According to embodiments, it may be possible to secure the reliability of the semiconductor device by reducing a parasitic capacitance between the conductive layer of the gate structure of the semiconductor device and the source/drain pattern, or between the conductive layer of the gate structure and the contact electrode.

DETAILED DESCRIPTION

Figure 1:
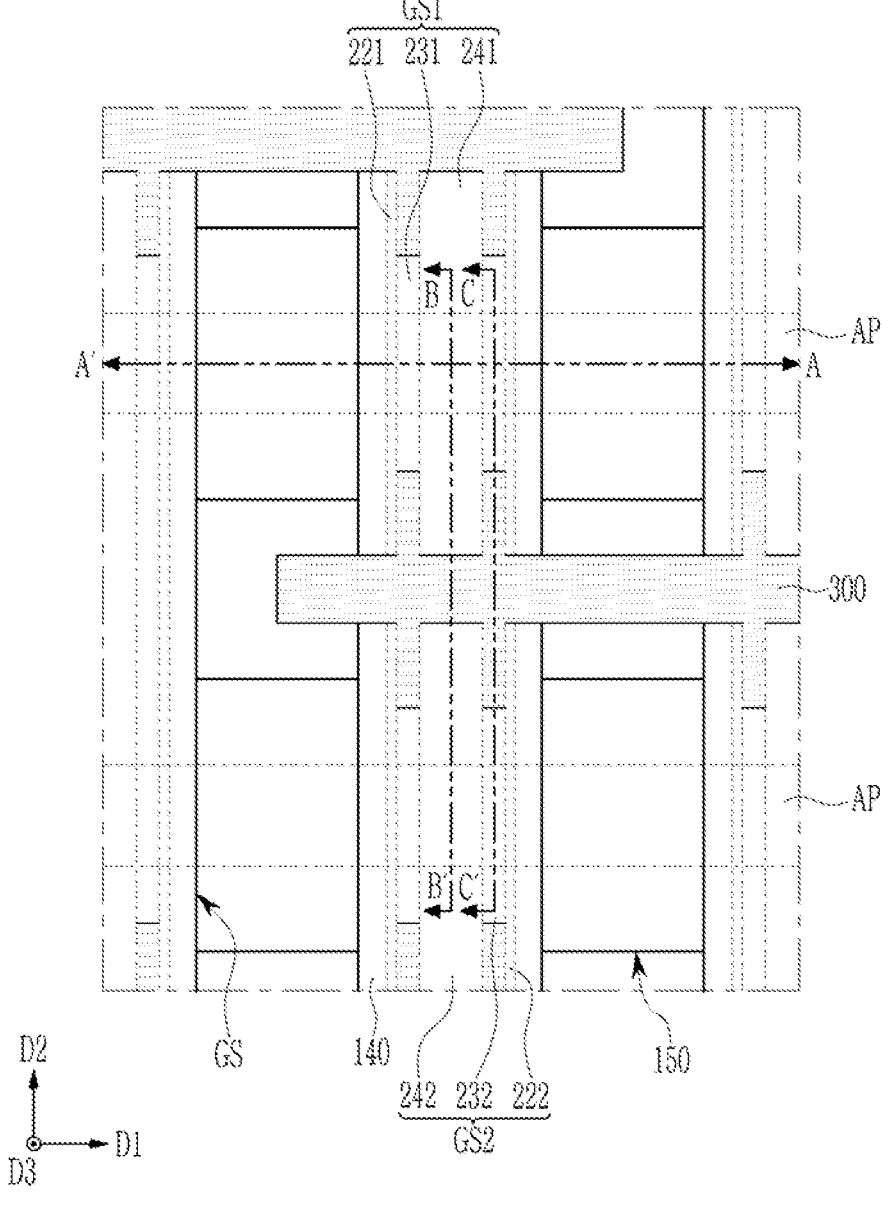
FIG. 1 is a top plan view illustrating a semiconductor device according to an embodiment.

In the following detailed description, embodiments of the present disclosure have been illustrated and described, simply by way of illustration. The present disclosure can be variously implemented and is not limited to embodiments described herein.

The drawings and description are to be regarded as illustrative in nature and not restrictive. Like reference numerals designate like elements throughout the specification.

In addition, the size and thickness of each configuration illustrated in the drawings may be arbitrarily illustrated for understanding and ease of description, but the present disclosure is not limited thereto. In the drawings, the thickness of layers, films, panels, regions, etc., may be exaggerated for clarity. In the drawings, for understanding and ease of description, the thickness of some layers and areas may be exaggerated.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "on" another element, it can be directly on the other element or intervening elements may also be present.

In addition, unless explicitly described to the contrary, the word "comprise", and variations such as "comprises" or "comprising", will be understood to imply the inclusion of stated elements but not the exclusion of any other elements.

Further, in the entire specification, when referring to a "plan view" a target part is viewed from above, and when referring to a "cross-sectional view", the cross-section obtained by cutting a target part vertically is viewed from the side.

The drawings of the semiconductor device illustrate, but are not limited to, transistors including nanowires or nanosheets, multi-bridge channel field effect transistors (MBCFET™), or fin-type transistors (FinFETs) including channel regions shaped in a fin-like pattern. Semiconductor devices according to some embodiments may include tunneling transistors (tunneling FETs), 3D stack field effect transistors (3DSFETs), complementary field effect transistors (CFETs), or the like.

Hereinafter, a semiconductor device according to an embodiment will be described with reference to FIG. 1, FIG. 2, FIG. 3, FIG. 4, and FIG. 5.

Figure 2:
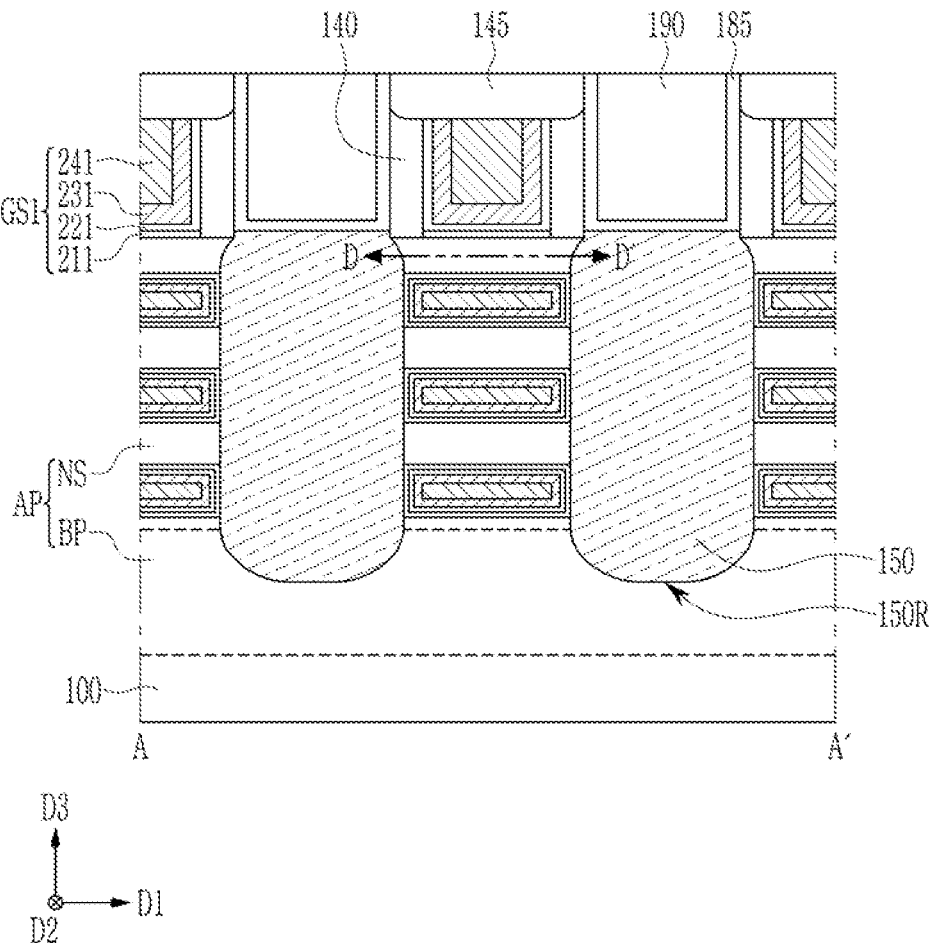
FIG. 2 is a cross-sectional view taken along line A-A' of FIG. 1.
Figure 3:
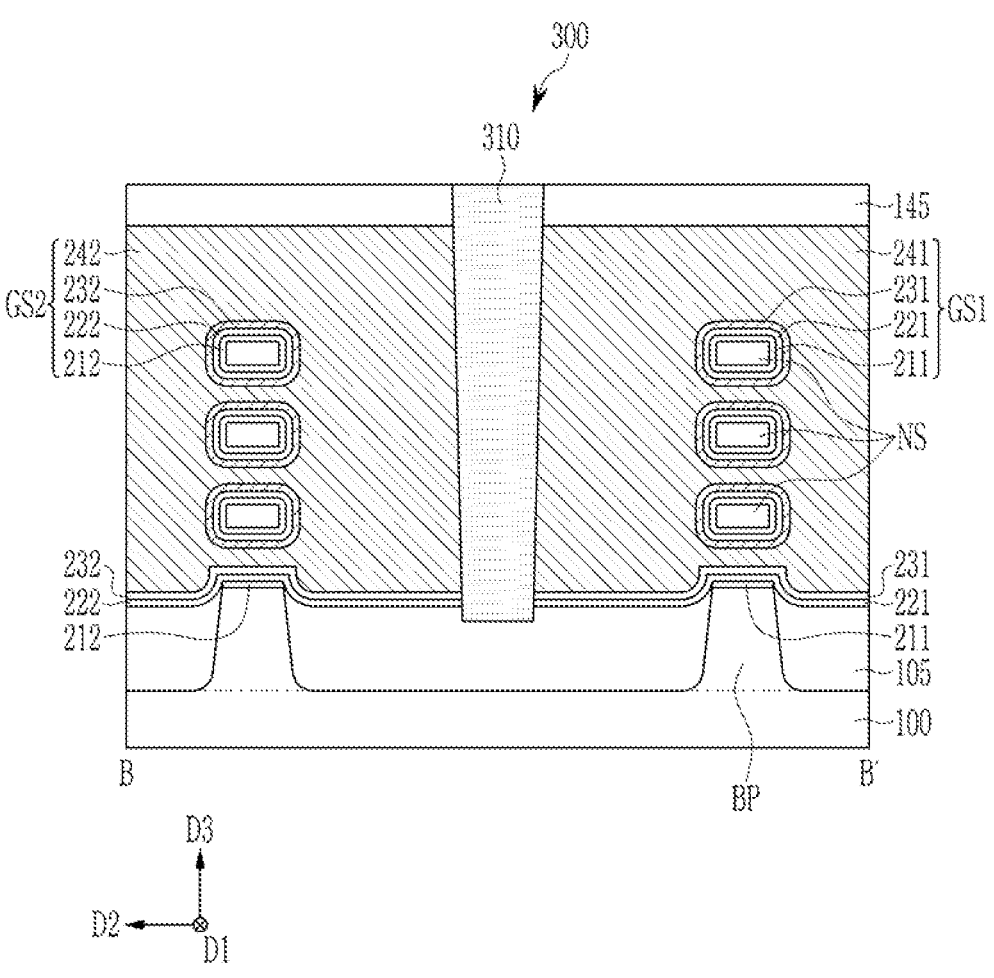
FIG. 3 is a cross-sectional view taken along line B-B' of FIG. 1.
Figure 4:
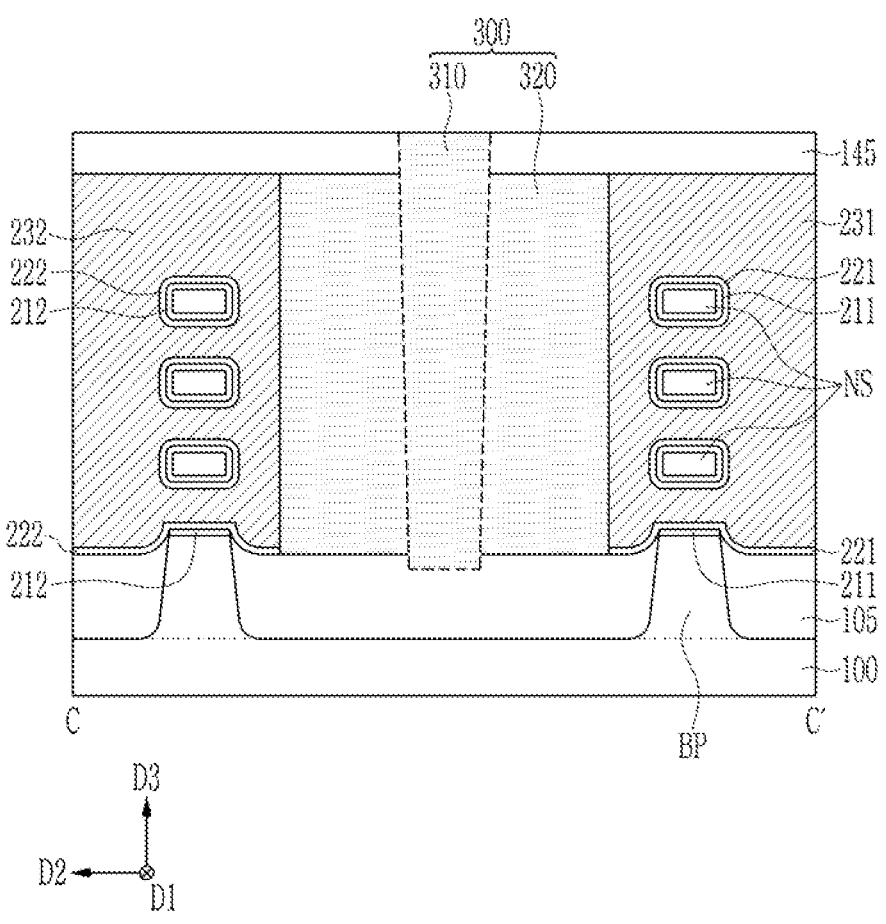
FIG. 4 is a cross-sectional view taken along line C-C' of FIG. 1.
Figure 5:
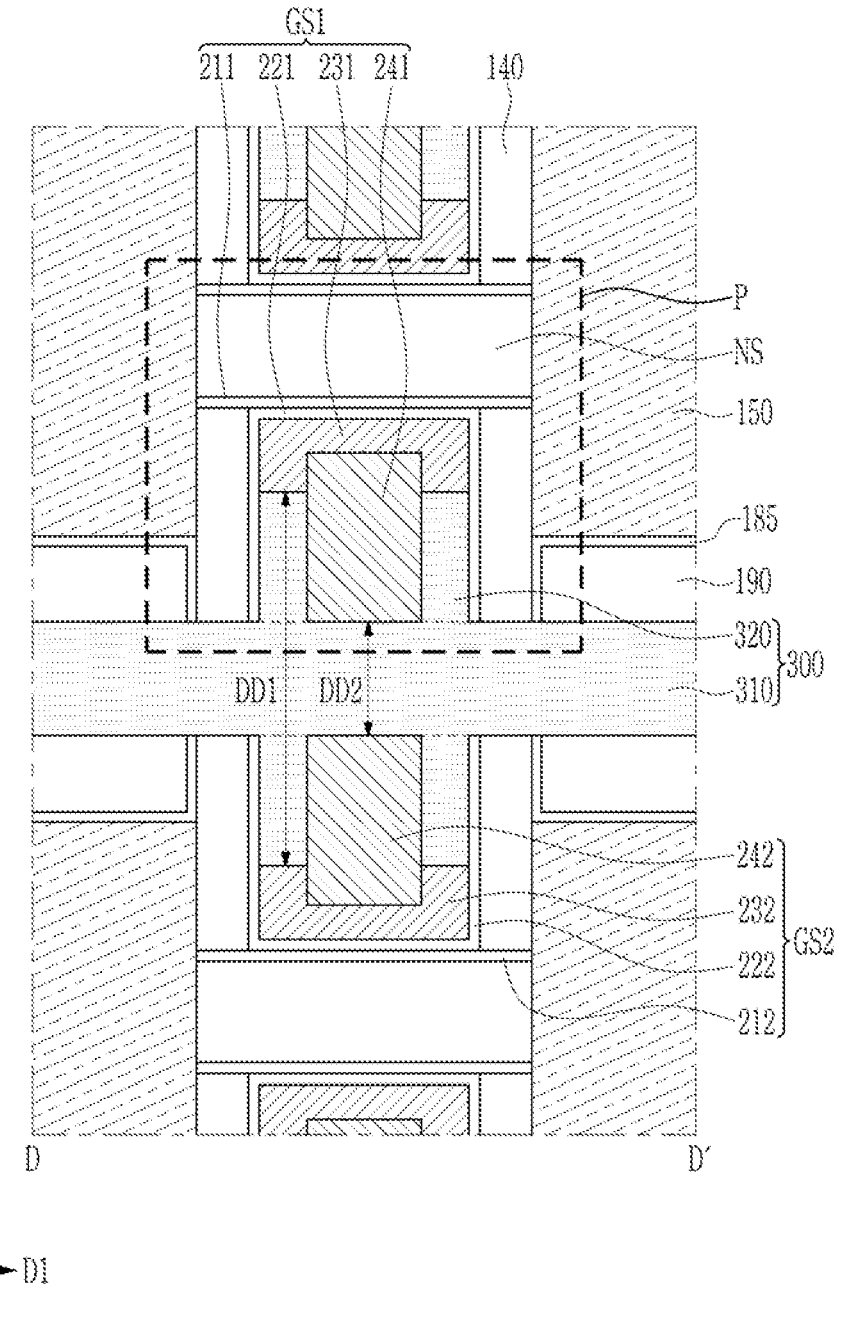
FIG. 5 is a top plan view taken along line D-D' of FIG. 2.

FIG. 1 is a top plan view illustrating a semiconductor device according to an embodiment. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is a top plan view taken along line D-D' of FIG. 2.

Referring to FIG. 1, FIG. 2, FIG. 3, FIG. 4, and FIG. 5, a semiconductor device according to an embodiment includes a substrate 100, an active pattern AP, a plurality of gate structures GS, a source/drain pattern 150, and a separation structure 300. The separation structure 300 may be, for example, an isolation structure. The semiconductor device according to an embodiment may further include a gate spacer 140 and a capping layer 145.

The substrate 100 may be bulk silicon or a silicon-on-insulator (SOI), for example. Alternatively, the substrate 100 may be a silicon substrate or may include other materials, such as, but not limited to, silicon germanium (SiGe), silicon germanium on insulator (SGOI), indium antimonide, lead telluride compounds, indium arsenide, indium phosphide, gallium arsenide, or gallium antimonide. An upper surface of the substrate 100 may be a plane parallel to a first direction D1 and a second direction D2 intersecting the first direction D1. For example, the first direction D1 and the second direction D2 form a plane, and the upper surface of the substrate 100 may be a plane parallel to the plane formed by the first direction D1 and the second direction D2.

The active pattern AP may be located on the substrate 100. The active pattern AP may be elongated in the first direction D1. In one example, the active pattern AP may be disposed in the region where a PMOS (p-channel metal-oxide-semiconductor) is formed. In another example, the active pattern AP may be disposed in the region where an NMOS is formed.

The active pattern AP may be a multichannel active pattern. The active pattern AP may include a lower pattern BP and a plurality of channel patterns NS. The plurality of channel patterns NS may be formed on the lower pattern BP. The lower pattern BP may protrude from the substrate 100 in a third direction D3. The lower pattern BP may be elongated in the first direction D1.

The plurality of channel patterns NS may be disposed on an upper surface of the lower pattern BP. The plurality of channel patterns NS may be spaced apart from the lower pattern BP in the third direction D3. Each channel pattern NS may be spaced apart in the third direction D3. Here, the third direction D3 may be a direction that intersects the first direction D1 and the second direction D2. For example, the third direction D3 may be a thickness direction of the substrate 100.

In FIG. 2, three channel patterns NS are illustrated as being stacked and spaced apart along the third direction D3, but this is for illustrative purposes and the channel patterns NS are not limited thereto. For example, four channel patterns NS may be stacked and spaced apart from each other in the third direction D3.

In FIG. 2, FIG. 3, and FIG. 4, the sides of the channel pattern NS are illustrated to be planar, but are not limited thereto. For example, the sides of the channel pattern NS may be a combination of a curved surface and a plane, or entirely curved.

The lower pattern BP may be formed by, for example, etching a portion of the substrate 100 or growing an epitaxial layer from the substrate 100. The lower pattern BP may include the elemental semiconductor materials, silicon (Si) or low-magnesium (Ge). Additionally, the lower pattern BP may include a compound semiconductor, for example, a group IV-IV compound semiconductor or a group Ill-V compound semiconductor.

The group IV-IV compound semiconductor may be a binary compound or a ternary compound including, for example, at least two of carbon (C), silicon (Si), germanium (Ge), or tin (Sn).

A group III-V compound semiconductor may be, for example, a binary compound, ternary compound, or tetrameric compound formed by combining at least one of the group Ill elements including aluminum (Al), gallium (Ga), and indium (In) with one of the group V elements phosphorus (P), arsenic (As), or antimony (Sb).

The channel pattern NS may include one of the elemental semiconductor materials silicon (Si) or silicon germanium (SiGe), the group IV-IV compound semiconductor, or the group Ill-V compound semiconductor. Each channel pattern NS may include the same material as that of the lower pattern BP or may include a different material from that of the lower pattern BP.

In the semiconductor device according to an embodiment, the lower pattern BP may be a silicon lower pattern including silicon (Si), and the channel pattern NS may be a silicon sheet pattern including silicon (Si).

A field insulation layer 105 may be disposed on the substrate 100. The field insulation layer 105 may be located on the sidewalls of the lower pattern BP. The field insulation layer 105 may not be located on an upper surface of the lower pattern BP.

In one example, the field insulation layer 105 may entirely cover sides of the lower pattern BP. The field insulation layer 105 may cover a portion of the sidewalls of the lower pattern BP. For example, the field insulation layer 105 may cover less than an entirety of the sidewalls of the lower pattern BP In such a case, a portion of the lower pattern BP may protrude in the third direction D3 higher than an upper surface of the field insulation layer 105.

Each channel pattern NS may be located higher than the upper surface of the field insulation layer 105. The field insulation layer 105 may include, for example, a film of an oxide, nitride, a nitride oxide, or a combination thereof. The field insulation layer 105 may be a single film, but is illustrated for illustrative purposes and is not limited thereto. For example, the field insulation layer 105 may include multiple films.

The plurality of gate structures GS may be located on the substrate 100. The plurality of gate structures GS may extend in the second direction D2. The plurality of gate structures GS may be arranged spaced apart in the first direction D1.

The plurality of gate structures GS may be disposed on an active pattern AP. The gate structure GS may traverse the active pattern AP in a plan view. The plurality of gate structures GS may intersect the lower pattern BP in the plan view. The plurality of gate structures GS may surround each channel pattern NS.

Each of the plurality of gate structures GS may include a plurality of sub-gate structures and a main gate structure. The plurality of sub-gate structures may be disposed between the channel patterns NS adjacent in the third direction D3, and between the lower pattern BP and the channel pattern NS. The main gate structure may be disposed on a topmost channel pattern NS.

The active pattern AP may include the plurality of channel patterns NS, and the gate structure GS may include the plurality of sub-gate structures. The number of the plurality of sub-gate structures may be proportional to the number of channel patterns NS included in the active pattern AP. For example, the number of plurality of sub-gate structures may be equal to the number of channel patterns NS. For example, as illustrated in FIG. 2, FIG. 3, and FIG. 4, the number of the plurality of sub-gate structures may be three. However, the present disclosure is not limited thereto, and may include four or more sub-gate structures, for example.

The plurality of sub-gate structures may be disposed between the upper surface of the lower pattern BP and a lower surface of a lowermost channel pattern NS, and between the upper surface of the channel pattern NS and the lower surface of the channel pattern NS facing each other in the third direction D3. The plurality of sub-gate structures may be adjacent to the source/drain pattern 150, as described herein. The main gate structure may be disposed on the plurality of sub-gate structures and the channel patterns NS. The main gate structure may be disposed on the upper surface of the channel pattern NS.

The plurality of gate structures GS may include a first gate structure GS1 and a second gate structure GS2. The first gate structure GS1 and the second gate structure GS2 may each extend in the second direction D2. The first gate structure GS1 and the second gate structure GS2 may be spaced apart from each other in the second direction D2. The first gate structure GS1 and the second gate structure GS2 may be separated by a separation structure 300, as described herein.

The first gate structure GS1 may include a first gate insulation layer 211, a first gate dielectric layer 221, a first conductive pattern 231, and a second conductive pattern 241 stacked sequentially from the channel pattern NS. For example, the first gate insulation layer 211, the first gate dielectric layer 221, the first conductive pattern 231, and the second conductive pattern 241 may be stacked sequentially around the channel pattern NS on upper, lower, and side surfaces of the channel pattern NS. The first gate structure GS1 may surround a respective portion of the channel pattern NS. Further, the second gate structure GS2 may include a second gate insulation layer 212, a second gate dielectric layer 222, a third conductive pattern 232, and a fourth conductive pattern 242 stacked sequentially from the channel pattern NS. For example, the second gate insulation layer 212, the second gate dielectric layer 222, the third conductive pattern 232, and the fourth conductive pattern 242 may be stacked sequentially around the channel pattern NS on upper, lower, and side surfaces of the channel pattern NS. The second gate structure GS2 may surround a respective portion of the channel pattern NS. A detailed description of the first gate structure GS1 and the second gate structure GS2 will be described hereinafter with reference to FIG. 6, FIG. 7, and FIG. 8.

The separation structure 300 may be disposed between the first gate structure GS1 and the second gate structure GS2. The separation structure 300 may be disposed on the field insulation layer 105. The plurality of separation structures 300 may be spaced apart from each other in the first direction D1, but are not limited thereto. The separation structure 300 may disposed between the first gate structure GS1 and the second gate structure GS2, which are aligned in the second direction D2.

In the semiconductor device according to one or more embodiments, a separation structure 300 may separate a pair of gate structures GS including the first gate structure GS1 and the second gate structure GS2. In other words, the separation structure 300 may substantially prevent short circuits between adjacent gate structures GS. In another example, a separation structure 300 may separate a plurality of pairs of gate structures. In this case, the separation structure 300 may extend in the first direction D1 to separate the first gate structure GS1 and the second gate structure GS2, and between a third gate structure (not illustrated) and a fourth gate structure (not illustrated). Here, the third gate structure and the fourth gate structure may be spaced apart from each other in the second direction D2 and may be spaced apart from the first gate structure GS1 and the second gate structure GS2, respectively, in the first direction D1.

The upper surface of the separation structure 300 may be disposed at a higher level than the upper surface of the gate structure GS. A capping layer 145 may be disposed on the gate structure GS, and the upper surface of the separation structure 300 and the upper surface of the capping layer 145 may be substantially at the same level in the third direction D3. The separation structure 300 may penetrate the capping layer 145 and the gate structure.

The separation structure 300 may include, for example, at least one of silicon nitride (SiN), silicon nitric oxide (SiON), silicon oxide (SiO$_2$), silicon carbonic nitride (SiOCN), silicon boron nitride (SiBN), silicon oxyboron nitride (SiOBN), or silicon oxycarbide (SiOC), or combinations thereof. The separation structure 300 may be a single membrane, but is not limited thereto. For example, the separation structure 300 may include multiple membranes.

The separation structure 300 may include a first portion 310 extending in the first direction D1 and a second portion 320 protruding from the first portion 310 toward the channel pattern NS. For example, the second portion 320 may protrude from the first portion 310 in the second direction D2.

The first portion 310 of the separation structure 300 may extend in the first direction D1. The first portion 310 may be disposed between source/drain patterns 150. The first portion 310 may be disposed between the first gate structure GS1 and the second gate structure GS2. The first portion 310 may penetrate the gate structure to separate the first gate structure GS1 and the second gate structure GS2. The first portion 310 may penetrate an interlayer insulation layer 190, an etch stop layer 185, and a gate spacer 140.

A side surface of the first portion 310 may be in contact with the interlayer insulation layer 190, the gate spacer 140, the first gate dielectric layer 221, and the second conductive pattern 241. The side surface of the first portion 310 may not be in contact with the first conductive pattern 231. The first portion 310 may be spaced apart from the first conductive pattern 231 in the second direction D2.

The first portion 310 may be disposed on the field insulation layer 105. For example, the first portion 310 may be recessed within the field insulation layer 105. For example, a bottom surface of the first portion 310 may be in contact with, and disposed within, a portion of the field insulation layer 105. In FIG. 3, the first portion 310 may penetrate the gate structure and may be recessed within the field insulation layer 105, but is not limited thereto. In another example, the first portion 310 may penetrate the field insulation layer 105 and extend into the interior of the substrate 100. In this case, a lowermost surface of the first portion 310 may be located at a lower level in the third direction D3 than a lowermost surface of the field insulation layer 105.

The second portion 320 of the separation structure 300 may extend along the second direction D2. In a plan view, the second portion 320 may protrude from the first portion 310 toward the channel pattern NS. The second portion 320 may be disposed on side portions of the first portion 310. For example, the second portion 320 may be disposed on both side portions of the first portion 310. The second portion 320 may be disposed between the channel pattern NS and the first portion 310 of the separation structure 300. The second portion 320 may be disposed between the first conductive pattern 231 and the first portion 310 of the separation structure 300, as described herein. The second portion 320 may be disposed between the third conductive pattern 232, as described herein, and the first portion 310 of the separation structure 300.

In a plan view, the second portion 320 may be disposed between the gate spacer 140 and the second conductive pattern 241. For example, the second portion 320 may be disposed between the first gate dielectric layer 221 and the second conductive pattern 241, which may be located inside the gate spacer 140. The second portion 320 may be disposed between the source/drain pattern 150 and the second conductive pattern 241. The side surface of the second portion 320 may overlap the second conductive pattern 241 in the first direction D1. The side surface of the second portion 320 may be in contact with the second conductive pattern 241.

As illustrated in FIG. 4, the second portion 320 may be located on the field insulation layer 105. For example, the second portion 320 may be in direct contact with the field insulation layer 105. A bottom surface of the second portion 320 may be located at a higher level than the bottom surface of the first portion 310. However, the present disclosure is not limited thereto, and the bottom surface of the second portion 320 may be located substantially at the same level as the bottom surface of the first portion 310. Alternatively, the lower surface of the second portion 320 may be located at a lower level than the lower surface of the first portion 310.

The gate spacer 140 may be disposed on the side surfaces of the gate structure GS. For example, the gate spacer 140 may be disposed between the source/drain pattern 150 and the first gate structure GS1, and between the source/drain pattern 150 and the second gate structure GS2. Specifically, the gate spacer 140 may be disposed between the source/drain pattern 150 and the first gate dielectric layer 221, as described herein, and between the source/drain pattern 150 and the second gate dielectric layer 222, as described herein.

For example, the gate spacer 140 may not be disposed between the lower pattern BP and the channel pattern NS. The gate spacer 140 may not be disposed between the channel patterns NS adjacent in the third direction D3. In another example, the gate spacer 140 may be disposed between the lower pattern BP and the channel pattern NS. The gate spacer 140 may be disposed between the channel patterns NS adjacent in the third direction D3. In this case, the gate spacer 140 may be located between the sub-gate structure and the source/drain pattern 150.

The gate spacer 140 may include, for example, at least one of silicon nitride (SiN), silicon nitric oxide (SiON), silicon oxide (SiO$_2$), silicon carbonic nitride (SiOCN), silicon boron nitride (SiBN), silicon oxyboron nitride (SiOBN), or silicon oxycarbide (SiOC), or combinations thereof. Although the gate spacer 140 may be a single layer, it is not limited thereto. For example, the gate spacer 140 may include multiple layers.

The capping layer 145 may be disposed on the gate structure GS and the gate spacer 140. An upper surface of the capping layer 145 and an upper surface of the interlayer insulation layer 190 may have a same height, and form a same plane. In some examples, the capping layer 145 may be disposed between the gate spacers 140. In this case, the upper surface of the capping layer 145 may have a same height as the upper surface of the gate spacer 140 and may be located in a same plane.

The capping layer 145 may include, for example, at least one of silicon nitride (SiN), silicon nitric oxide (SiON), silicon carbon nitride (SiCN), or silicon carbonic nitride (SiOCN), or combinations thereof. The capping layer 145 may include a material having an etch selectivity with respect to the interlayer insulation layer 190.

The source/drain pattern 150 may be disposed on the active pattern AP. Specifically, the source/drain pattern 150 may be disposed on the lower pattern BP.

The source/drain pattern 150 may be disposed within a source/drain recess 150R having a depth along the third direction D3. The source/drain pattern 150 may fill the source/drain recess 150R. A bottom surface of the source/drain recess 150R may be defined by the lower pattern BP. A side surface of the source/drain recess 150R may be defined by the gate structure GS.

The source/drain patterns 150 may be disposed on sides of the gate structure GS. For example, the source/drain patterns 150 may be disposed on sides of the first gate structure GS1 and on sides of the second gate structure. More particularly, the source/drain patterns 150 may be disposed on both sides of the first gate structure GS1 and on both sides of the second gate structure. The source/drain pattern 150 may contact at least a portion of the gate spacer 140.

The source/drain patterns 150 may be epitaxial patterns formed by a selective epitaxial growth process that uses the active pattern AP as a seed. The source/drain pattern 150 may include, for example, at least one of silicon (Si) or silicon germanium (SiGe). The channel pattern NS may be a portion of the active pattern AP extending between the source/drain patterns 150. The source/drain pattern 150 may serve as a source/drain of a transistor using the channel pattern NS as a channel region.

The semiconductor device according to an embodiment may further include the etch stop layer 185, and the interlayer insulation layer 190.

The etch stop layer 185 may be disposed on the side surfaces of the gate spacer 140 and on the upper surface of the source/drain pattern 150. The etch stop layer 185 may include a material having an etch selectivity with respect to the interlayer insulation layer 190, described herein. The etch stop layer 185 may include, for example, at least one of silicon nitride (SiN), silicon nitric oxide (SiON), silicon carbonic nitride (SiOCN), silicon boron nitride (SiBN), silicon oxyboron nitride (SiOBN), or silicon oxycarbide (SiOC), or combinations thereof.

The interlayer insulation layer 190 may be disposed on the etch stop layer 185. The interlayer insulation layer 190 may be disposed on the source/drain pattern 150. The interlayer insulation layer 190 may not cover the upper surface of the capping layer 145. For example, the upper surface of the interlayer insulation layer 190 may be exposed by the upper surface of the capping layer 145 at an upper surface.

The interlayer insulation layer 190 may include, for example, at least one of silicon oxide (SiO$_2$), silicon nitride (SiN), silicon nitric oxide (SiON), or a low-k material. The low-k material may include, for example, Fluorinated TetraEthylOrthoSilicate (FTEOS), Hydrogen SilsesQuioxane (HSQ), Bis-benzoCycloButene (BCB), TetraMethylOrtho-Silicate (TMOS), OctaMethyleyCloTetraSiloxane (OMCTS), HexaMethylDiSiloxane (HMDS), TriMethylSilylBorate (TMSB), DiAcetoSDitertiane (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped Silicon Oxide), OSG (Organo Silicate Glass), SiLK, Amorphous Fluorinated Carbon, silica aerogels, silica xerogels, or mesoporous silica, or combinations thereof, but is not limited thereto.

Hereinafter, the first gate structure GS1 and the second gate structure GS2 will be described with reference to FIG. 6, FIG. 7, and FIG. 8.

Figure 6:
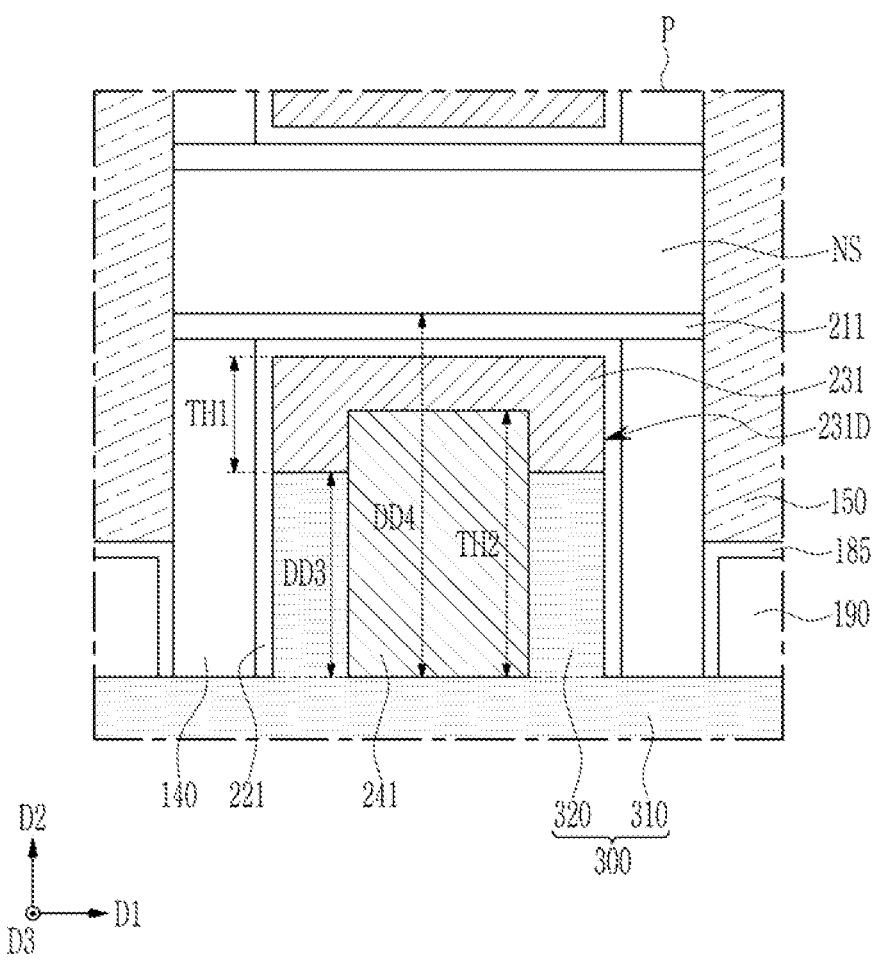
FIG. 6 is an enlarged top plan view of region P of FIG. 5.

FIG. 6 is an enlarged plane view of region P of FIG. 5. FIG. 7 and FIG. 8 are top plan views corresponding to region P of FIG. 5 of the semiconductor device according to some embodiments.

Hereinafter, the first gate structure GS1 will be described in detail. However, this is for illustrative purposes; the second gate structure GS2 contains the same content as the first gate structure GS1.

Referring to FIG. 5 and FIG. 6, the first gate structure GS1 may include the first gate insulation layer 211, the first gate dielectric layer 221, the first conductive pattern 231, and the second conductive pattern 241 stacked sequentially from the channel pattern NS. For example, the first gate insulation layer 211, the first gate dielectric layer 221, the first conductive pattern 231, and the second conductive pattern 241 may be stacked sequentially around the channel pattern NS.

The first conductive pattern 231 may be disposed on the lower pattern BP. The first conductive pattern 231 may intersect with the lower pattern BP. The first conductive pattern 231 may surround the channel pattern NS.

At least a portion of the first conductive pattern 231 may be disposed on the stacked structure of the channel pattern NS. Other portions of the first conductive pattern 231 may cover side surfaces of the stacked structure of the channel pattern NS. In this case, four sides of the channel pattern NS may be surrounded by the first conductive pattern 231.

The first conductive pattern 231 may be disposed on a side of the source/drain pattern 150. The source/drain patterns 150 may be disposed on sides in the first direction D1 relative to the first conductive pattern 231. For example, the source/drain patterns 150 may be located on both sides in the first direction D1 relative to the first conductive pattern 231.

The first conductive pattern 231 may be disposed between the channel pattern NS and the separation structure 300. For example, the first conductive pattern 231 may be disposed between the channel pattern NS and the first portion 310 of the separation structure 300, and between the channel pattern NS and the second conductive pattern 241. Accordingly, a length TH1 along the second direction D2 of the first conductive pattern 231 may be shorter than a length DD4 along the second direction D2 between the channel pattern NS and the first portion 310.

The first conductive pattern 231 may be spaced apart from the first portion 310 of the separation structure 300. For example, the first conductive pattern 231 may be spaced apart from the first portion 310 in the second direction D2 with the second portion 320 interposed therebetween. The first conductive pattern 231 may be disposed adjacent to the second portion 320 of the separation structure 300. For example, the first conductive pattern 231 may be in contact with the second portion 320 of the separation structure 300. Accordingly, a length DD3 along the second direction D2 between the first conductive pattern 231 and the first portion 310 may be shorter than the length DD4 along the second direction D2 between the first portion 310 and the channel pattern NS.

At least a portion of the first conductive pattern 231 may surround at least a portion of the second conductive pattern 241. At least a portion of the first conductive pattern 231 may overlap the second conductive pattern 241 in the first direction D1, and another portion may overlap the second conductive pattern 241 in the second direction D2. At least a portion of the first conductive pattern 231 may be in contact with a side surface of the second conductive pattern 241.

At least a portion of the first conductive pattern 231 may be disposed between the gate spacer 140 and the second conductive pattern 241. For example, as illustrated in FIG. 6, in a plan view, the first conductive pattern 231 may include a protrusion 231D. The protrusion 231D may be located between the gate spacer 140 and the second conductive pattern 241. The protrusion 231D may be a region of the first conductive pattern 231 that overlaps the second conductive pattern 241 in the first direction D1. The protrusion 231D may surround at least a portion of the second conductive pattern 241. For example, the first conductive pattern 231 and the protrusion 231D may surround at least an end portion of the second conductive pattern 241. Additionally, the protrusion 231D may be in contact with the left edge and the right edge of the second conductive pattern 241. That is, the protrusion 231D may be in contact with the edge of the side surface opposite the gate spacer 140 of the second conductive pattern 241. In this case, the protrusion 231D may be spaced apart from the first portion 310 of the separation structure 300.

Figure 7:
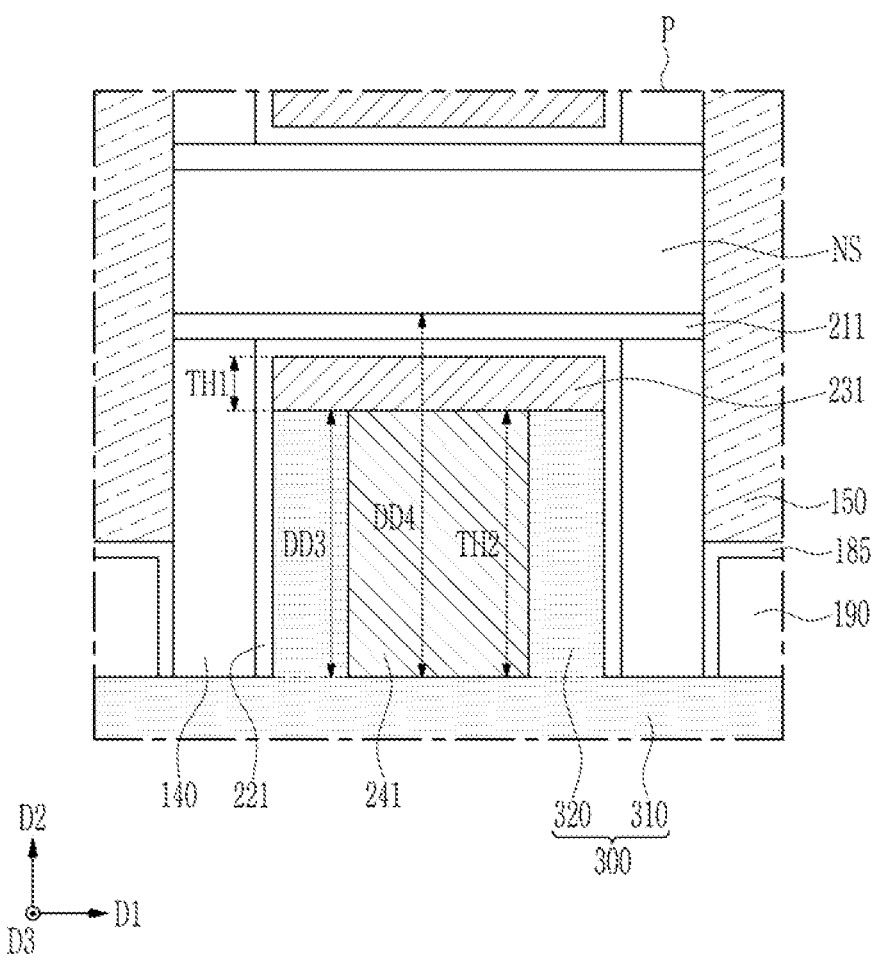
FIG. 7 and FIG. 8 are top plan views corresponding to region P of FIG. 5 illustrating the semiconductor device according to some embodiments.
Figure 8:
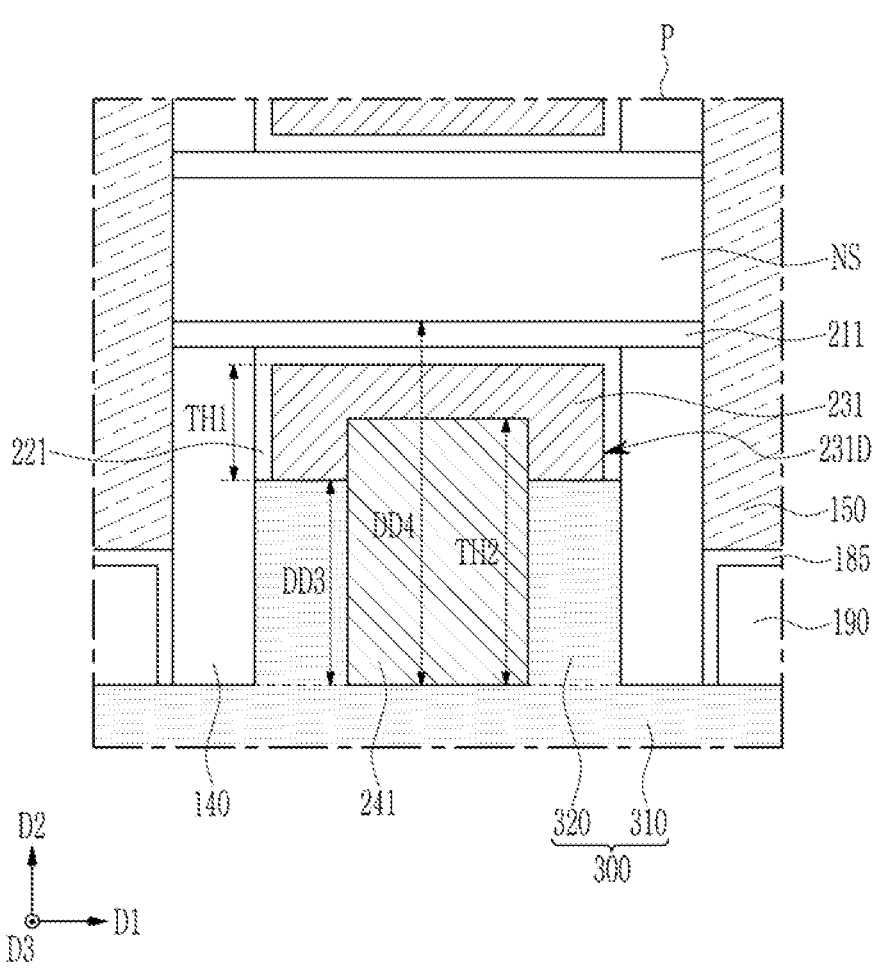

However, the present disclosure is not limited thereto, and the first conductive pattern 231 may not be located between the gate spacer 140 and the second conductive pattern 241, as illustrated in FIG. 7. In this case, the first conductive pattern 231 may not be in contact with a portion of a left edge or a right edge of the second conductive pattern 241 in the plane.

The first conductive pattern 231 may include a work function metal that regulates the threshold voltage of the transistor. By adjusting the thickness and composition of the first conductive pattern 231, a threshold voltage suitable for characteristics of the transistor may be achieved. For example, the first conductive pattern 231 may include at least one metal. The metal may include at least one of titanium (Ti), tantalum (Ta), aluminum (Al), tungsten (W), or molybdenum (Mo), and nitrogen (N). Further, the first conductive pattern 231 may further include carbon (C). The first conductive pattern 231 may include a plurality of stacked work function metal films. In this case, a dielectric constant of the first conductive pattern 231 may be greater than a dielectric constant of the separation structure 300.

The second conductive pattern 241 may be disposed on the lower pattern BP. The second conductive pattern 241 may intersect with the lower pattern BP. In a cross-sectional view, as illustrated in FIG. 3, the second conductive pattern 241 may surround the first conductive pattern 231.

At least a portion of the second conductive pattern 241 may be disposed on the stacked structure of the channel pattern NS. Other portions of the second conductive pattern 241 may cover side surfaces of the stacked structure of the channel pattern NS. In this case, the four sides of the channel pattern NS may be surrounded by the second conductive pattern 241.

The second conductive pattern 241 may be disposed between the channel pattern NS and the separation structure 300. For example, the second conductive pattern 241 may be disposed between the channel pattern NS and the first portion 310 of the separation structure 300. The second conductive pattern 241 may be disposed between the first conductive pattern 231 and the first portion 310 of the separation structure 300. Accordingly, the length TH2 of the second conductive pattern 241 along the second direction D2 may be shorter than the fourth length DD4 between the channel pattern NS and the first portion 310 of the separation structure 300.

The second conductive pattern 241 may be disposed on a side of the source/drain pattern 150, described herein. The source/drain pattern 150 may be disposed on sides in the second direction D2 relative to the second conductive pattern 241. For example, the source/drain pattern 150 may be disposed on both sides in the second direction D2 relative to the second conductive pattern 241.

In a plan view, the second conductive pattern 241 may be surrounded by the separation structure 300 and the first conductive pattern 231. For example, at least a portion of the side surface of the second conductive pattern 241 may overlap in the first direction D1 with the second portion 320 of the separation structure 300. Additionally, a remaining portion of the side surface of the second conductive pattern 241 may overlap the first conductive pattern 231 in the first direction D1.

In one example, a side surface of the second conductive pattern 241 along the second direction D2 may be in contact with the first portion 310 of the separation structure 300, and another side surface may be in contact with the first conductive pattern 231. In addition, the side surfaces of the second conductive pattern 241 along the first direction D1 may be in contact with the first conductive pattern 231 and the second portion 320 of the separation structure 300. That is, at least a portion of a side surface of the second conductive pattern 241 may be in contact with the first conductive pattern 231, and a remaining portion may be in contact with the second portion 320 of the separation structure 300. In other words, at least a portion of the second conductive pattern 241 may be surrounded by the first conductive pattern 231. Accordingly, a length TH2 of the second conductive pattern 241 along the second direction D2 may be longer than a third length DD3 of the second portion 320 of the separation structure 300 along the second direction D2. However, the present disclosure is not limited thereto, and the length TH2 of the second conductive pattern 241 along the second direction D2 may be substantially the same as the third length DD3 of the second portion 320 of the separation structure 300 along the second direction D2, as illustrated in FIG. 7.

The second conductive pattern 241 may include at least one of a metal, a metal alloy, a conductive metal nitride, a metal silicide, a doped semiconductor material, a conductive metal oxide, or a conductive metal nitride. The second conductive pattern 241 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (Ta-TiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium Nitride (NbN), niobium Carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), or vanadium (V), or combinations thereof, but is not limited thereto. The conductive metal oxide and the conductive metal nitroxide may include an oxidized form of the above material, but are not limited thereto.

The first gate insulation layer 211 may extend along the upper surface of the lower pattern BP. The first gate insulation layer 211 may be disposed along the circumference of the channel pattern NS. The first gate insulation layer 211 may be in direct contact with the lower pattern BP, the source/drain pattern 150, and the channel pattern NS. The first gate insulation layer 211 may be interposed between the channel pattern NS and the first gate dielectric layer 221.

The first gate insulation layer 211 may not extend along the side surfaces of the gate spacer 140, as described herein. The first gate insulation layer 211 may include, for example, silicon oxide ($SiO_2$). However, the present disclosure is not limited thereto, and the first gate insulation layer 211 may extend along the side surface of the gate spacer 140.

The first gate dielectric layer 221 may extend along the upper surface of the field insulation layer 105 and the upper surface of the first gate insulation layer 211. The first gate dielectric layer 221 may surround the plurality of channel patterns NS. The first gate dielectric layer 221 may be disposed along the circumference of the channel pattern NS. The first gate dielectric layer 221 may be interposed between the first conductive pattern 231 and the first gate insulation layer 211.

In a plan view, the first gate dielectric layer 221 may be interposed between the first conductive pattern 231 and the channel pattern NS, and between the first conductive pattern 231 and the gate spacer 140. As illustrated in FIG. 6, the first gate dielectric layer 221 may be interposed between the second portion 320 of the separation structure 300 and the gate spacer 140. That is, the first gate dielectric layer 221 may extend along the side surface of the second portion 320 of the separation structure 300. However, the present disclosure is not limited thereto, and the first gate dielectric layer 221 may not extend along the side surface of the second portion 320 of the separation structure 300, as illustrated in FIG. 8. In this case, the first gate dielectric layer 221 may not be interposed between the second portion 320 of the separation structure 300 and the gate spacer 140.

The first gate dielectric layer 221 may include, for example, a high dielectric constant material. The high dielectric constant material may include a material having a higher dielectric constant than silicon oxide ($SiO_2$), such as hafnium oxide (HfO), aluminum oxide (AlO), or tantalum oxide (TaO).

The second gate structure GS2 may include a second gate insulation layer 212, a second gate dielectric layer 222, a third conductive pattern 232, and a fourth conductive pattern 242 stacked sequentially from the channel pattern NS. For example, the second gate insulation layer 212, the second gate dielectric layer 222, the third conductive pattern 232, and the fourth conductive pattern 242 stacked sequentially around the channel pattern NS.

The third conductive pattern 232 may be disposed on the lower pattern BP. The third conductive pattern 232 may surround the channel pattern NS.

The third conductive pattern 232 may be disposed between the channel pattern NS and the separation structure 300. The third conductive pattern 232 may be spaced apart from the first portion 310 of the separation structure 300. At least a portion of the third conductive pattern 232 may surround at least a portion of the fourth conductive pattern 242. At least a portion of the third conductive pattern 232 may be disposed between the gate spacer 140 and the fourth conductive pattern 242. The third conductive pattern 232 may be substantially the same the first conductive pattern 231 of the first gate structure GS1 and a further description thereof may be omitted.

The fourth conductive pattern 242 may be disposed on the lower pattern BP. In a cross-sectional view, as illustrated in FIG. 3, the fourth conductive pattern 242 may surround the third conductive pattern 232.

At least a portion of the fourth conductive pattern 242 may be disposed on the stacked structure of the channel pattern NS. The fourth conductive pattern 242 may be disposed between the channel pattern NS and the separation structure 300. In a plan view, the fourth conductive pattern 242 may be surrounded by the separation structure 300 and the third conductive pattern 232. The fourth conductive pattern 242 may be substantially the same as the second conductive pattern 241 of the first gate structure GS1 and a further description thereof may be omitted.

The first distance DD1 between the first conductive pattern 231 and the third conductive pattern 232 may be greater than the second distance DD2 between the second conductive pattern 241 and the fourth conductive pattern 242. For example, the second conductive pattern 241 and the fourth conductive pattern 242 may be in contact with the first portion 310 of the separation structure 300, and the first conductive pattern 231 and the third conductive pattern 232 may be spaced apart from the first portion 310 of the separation structure 300, such that the space between the first conductive pattern 231 and the third conductive pattern 232 may be further than the space between the second conductive pattern 241 and the fourth conductive pattern 242.

The second gate dielectric layer 222 and the second gate insulation layer 212 are substantially the same as the first gate dielectric layer 221 and the first gate insulation layer 211, respectively, and further descriptions thereof may be omitted.

Parasitic capacitance may occur between the conductive layer of the gate structure GS and the source/drain pattern 150 of the semiconductor device. Here, the magnitude of the parasitic capacitance may depend on the distance between the conductive layer of the gate structure GS and the source/drain pattern 150 and the dielectric constant of the dielectric located between the conductive layer of the gate structure GS and the source/drain pattern 150. According to an embodiment, the greater the distance between the conductive layer of the gate structure GS and the source/drain pattern 150, the smaller the parasitic capacitance may be. The lower the dielectric constant of the dielectric located between the conductive layer of the gate structure GS and the source/drain pattern 150, the lower the parasitic capacitance may be.

Portions of edges of the second conductive pattern 241 of the semiconductor device according to an embodiment may be covered by the first conductive pattern 231, and the remaining portion may not be covered by the first conductive pattern 231. Additionally, the remaining portions of edges of the second conductive pattern 241 that are not covered by the first conductive pattern 231 may be covered by the second portion 320 of the separation structure 300. The separation structure 300 may be made of an insulating material, and may be a dielectric that is located between the second conductive pattern 241 and the source/drain pattern 150.

For the semiconductor device according to an embodiment, the parasitic capacitance between the conductive layer of the gate structure GS and the source/drain pattern 150 may be reduced compared to the capacitance that may occur when edges of the second conductive pattern 241 are entirely covered by the first conductive pattern 231. For example, the distance between the conductive layer of the gate structure GS and the source/drain pattern 150 may increase as the thickness of the dielectric located between the conductive layer of the gate structure GS and the source/drain pattern 150 is increased, and the parasitic capacitance between the conductive layer of the gate structure GS and the source/drain pattern 150 may be reduced. Due to the reduction of parasitic capacitance, the reliability of semiconductor devices may be improved.

Hereinafter, semiconductor devices according to some embodiment will be described with reference to FIG. 9 and FIG. 10.

Figure 9:
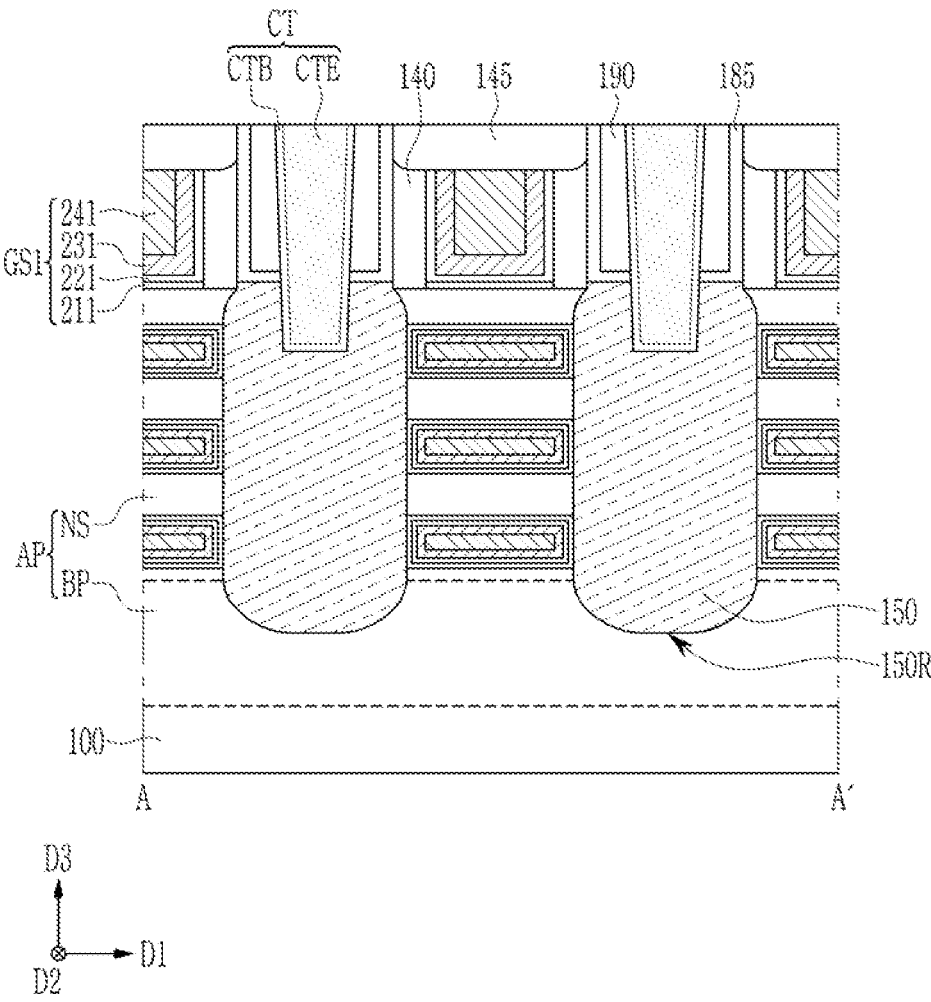
FIG. 9 is a cross-sectional view corresponding to A-A' of FIG. 1 illustrating the semiconductor device according to some embodiments.

FIG. 9 is a cross-sectional view corresponding to A-A' of FIG. 1 illustrating the semiconductor device according to some embodiments. FIG. 10 is a cross-sectional view corresponding to D-D' of FIG. 2 illustrating the semiconductor device according to some embodiments.

Figure 10:
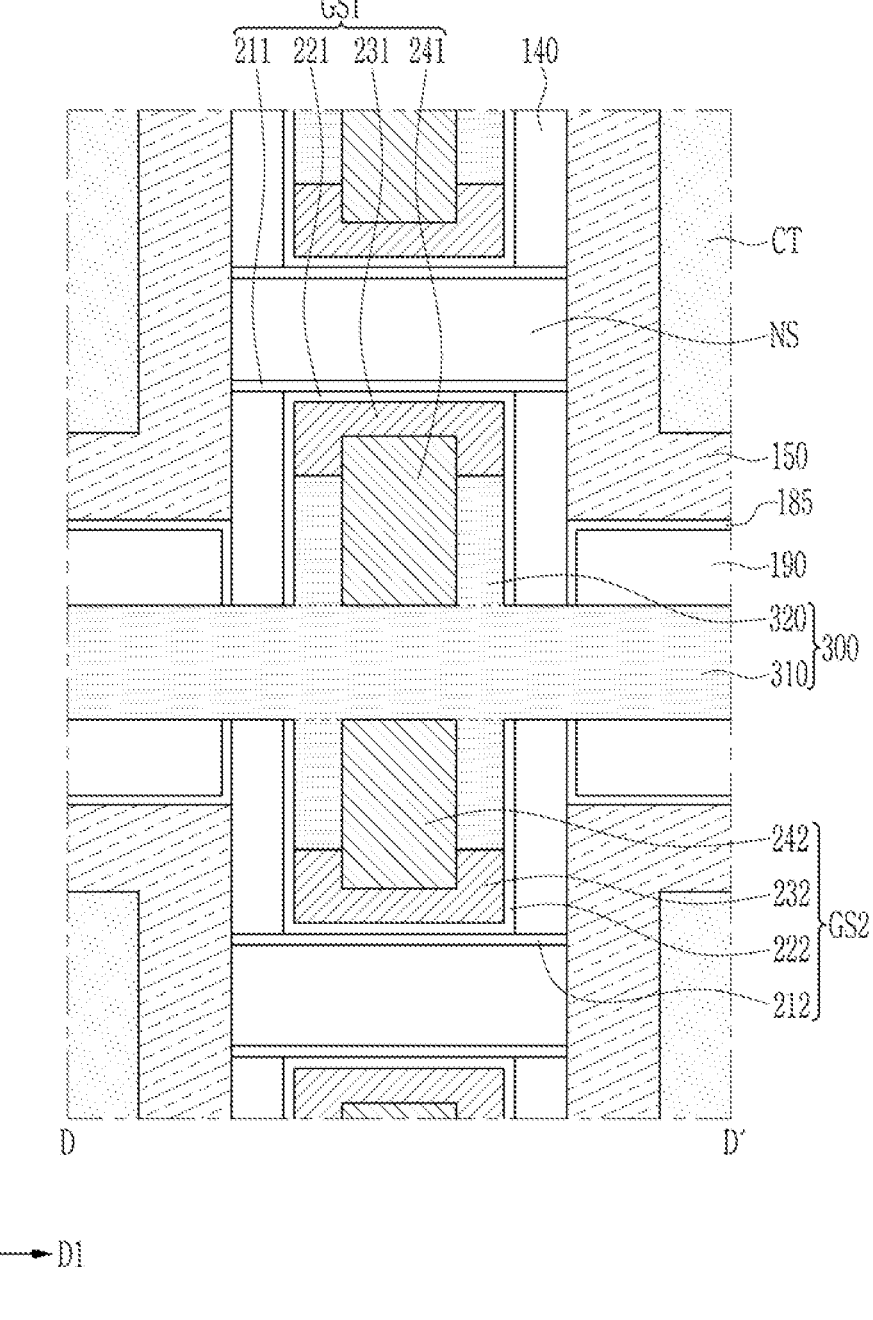
FIG. 10 is a cross-sectional view corresponding to D-D' of FIG. 2 illustrating the semiconductor device according to some embodiments.

Referring further to FIG. 9 and FIG. 10, the semiconductor device according to an embodiment may further include a contact electrode CT.

The contact electrode CT may be disposed above the source/drain pattern 150. The contact electrode CT may be electrically connected with the source/drain pattern 150. The contact electrode CT may extend in the second direction D2. The contact electrode CT may penetrate at least one interlayer insulation layer 190.

As illustrated in FIG. 9, the lower surface of the contact electrode CT may be disposed, for example, at a lower level than the channel pattern located at the uppermost portion of the channel pattern NS. However, the present disclosure is not limited thereto, and the lower surface of the contact electrode CT may be higher than or equal to the lower surface of the channel pattern NS located at the uppermost portion of the channel pattern NS. Alternatively, the lower surface of the contact electrode CT may be disposed between the lower surface of the channel pattern (NS) that is disposed in the lowermost channel pattern and the lower surface of the channel pattern that is located in the highest channel pattern.

The contact electrode CT may include a conductive pattern CTE and a barrier pattern CTB surrounding the conductive pattern CTE. For convenience of the description, FIG. 10 omits the illustration of the conductive pattern CTE and the barrier pattern CTB.

The conductive pattern CTE may include at least one of, for example, a metal, a metal alloy, a conductive metal nitride, a conductive metal carbide, a conductive metal oxide, a conductive metal carbonitride, or a two-dimensional (2D) material.

The barrier pattern CTB may cover side surfaces and the lower surface of the conductive pattern CTE. The barrier pattern CTB may expose a top surface of the conductive pattern CTE. The barrier pattern CTB may include metals, metal alloys, and conductive metal nitrides. The metal may include at least one of titanium (Ti), tantalum (Ta), tungsten (W), nickel (Ni), cobalt (Co), or platinum (Pt). The conductive metal nitride may include at least one of titanium nitride (TiN), tantalum nitride (TaN), tungsten nitride (WN), nickel nitride (NiN), cobalt nitride (CoN), or platinum nitride (PtN).

The contact electrode CT may be a double film including the conductive pattern CTE and the barrier pattern CTB, but is not limited thereto.

A metal silicide film may be located between the source/drain pattern 150 and the contact electrode CT of the semiconductor device according to an embodiment. The metal silicide film may include a metal silicide.

Parasitic capacitance between the conductive layer of the gate structure GS and the source/drain pattern 150, and between the conductive layer of the gate structure GS and the contact electrode CT of the semiconductor device, may be reduced or prevented according to an embodiment.

Portions of edges of the second conductive pattern 241 of the semiconductor device according to an embodiment may be covered by the first conductive pattern 231, and the remaining portion may not be covered by the first conductive pattern 231. Additionally, the remaining portions of edges of the second conductive pattern 241 that are not covered by the first conductive pattern 231 may be covered by the second portion 320 of the separation structure 300. The separation structure 300 may be made of an insulating material, and may be a dielectric that is located between the second conductive pattern 241 and the contact electrode CT.

For the semiconductor device according to an embodiment, the parasitic capacitance between the conductive layer of the gate structure GS and the contact electrode CT may be reduced compared to the capacitance that may occur when edges of the second conductive pattern 241 are entirely covered by the first conductive pattern 231. For example, the distance between the conductive layer of the gate structure GS and the conductive electrode CT may increase as the thickness of the dielectric located between the conductive layer of the gate structure GS and the conductive electrode CT is increased, and the parasitic capacitance between the conductive layer of the gate structure GS and the contact electrode CT may be reduced. Due to the reduction of parasitic capacitance, the reliability of semiconductor devices may be improved.

Hereinafter, semiconductor devices according to some embodiment will be described with reference to FIG. 11 and FIG. 12.

Figure 11:
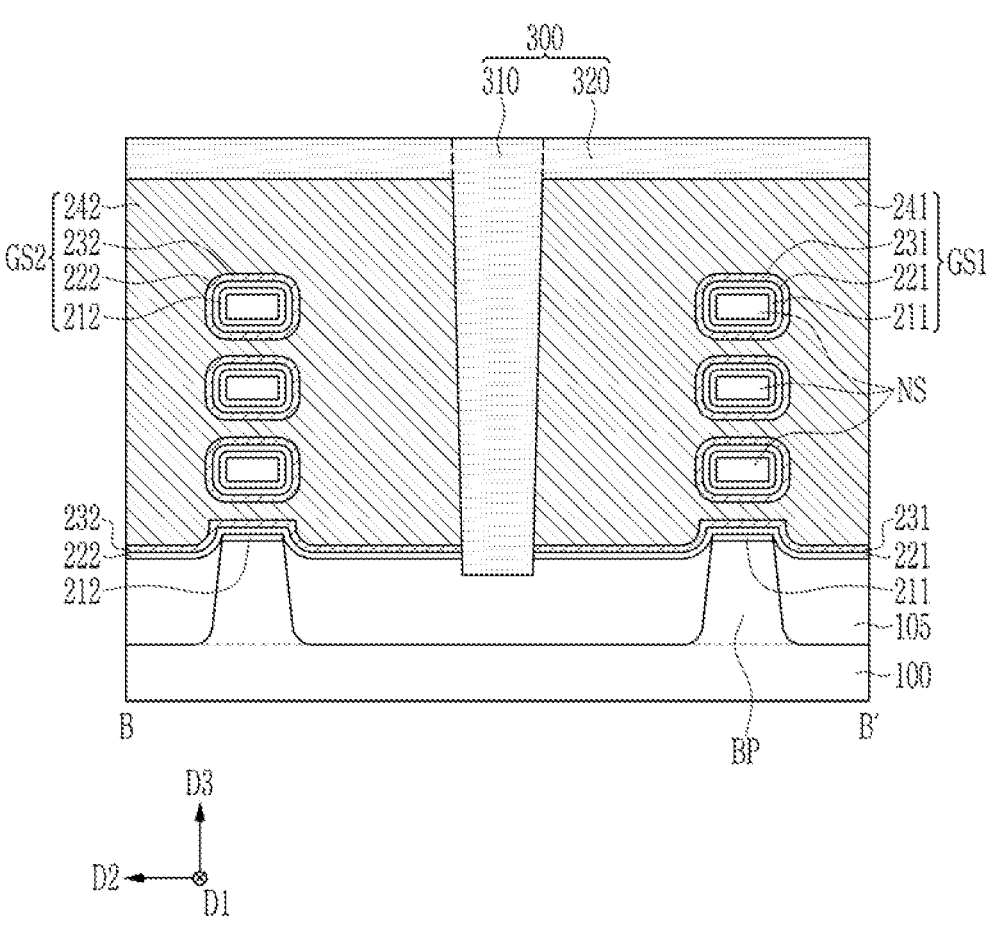
FIG. 11 is a cross-sectional view corresponding to B-B' of FIG. 1 illustrating the semiconductor device according to some embodiments.

FIG. 11 is a cross-sectional view corresponding to B-B' of FIG. 1 illustrating the semiconductor device according to some embodiments. FIG. 12 is a cross-sectional view corresponding to C-C' of FIG. 1 illustrating the semiconductor device according to some embodiments.

Figure 12:
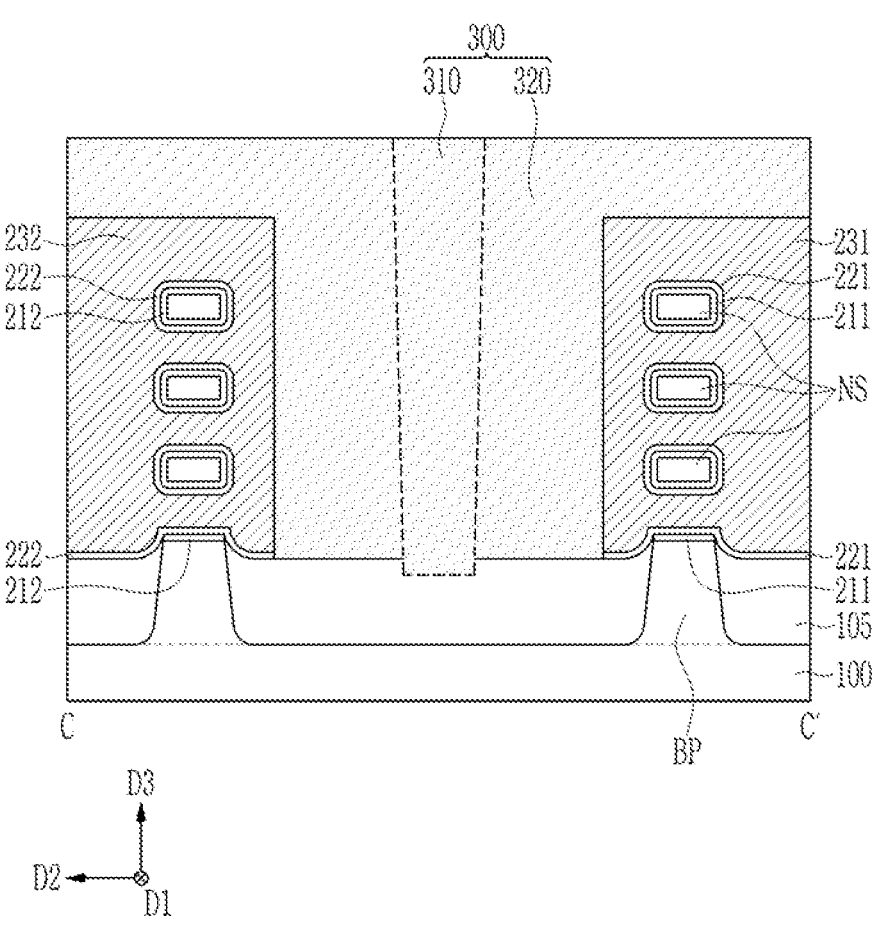
FIG. 12 is a cross-sectional view corresponding to C-C' of FIG. 1 illustrating the semiconductor device according to some embodiments.

Since embodiments illustrated in FIG. 11 and FIG. 12 have substantially the same in some parts as those illustrated in FIG. 1, FIG. 2, FIG. 3, FIG. 4, FIG. 5, and FIG. 6, a description thereof may be omitted. In an embodiment, the capping layer 145 is omitted, and the shape of the separation structure 300 is different from those of the previous embodiments, which will be described below.

The semiconductor device according to an embodiment may include a substrate 100, an active pattern AP, a plurality of gate structures GS, a source/drain pattern 150, a separation structure 300, a gate spacer 140, an etch stop layer 185, and an interlayer insulation layer 190.

In the foregoing embodiment, the capping layer 145 may be disposed above the gate structure GS and the gate spacer 140. An upper surface of the capping layer 145 and an upper surface of the interlayer insulation layer 190 may be placed on the same plane.

Further, a first portion 310 of the separation structure 300 may be disposed between the first gate structure GS1 and the second gate structure GS2.

Referring to FIG. 11 and FIG. 12, the separation structure 300 of the semiconductor device according to some embodiments may include the first portion 310 and a second portion 320.

The first portion 310 of the separation structure 300 may be disposed between the first gate structure GS1 and the second gate structure GS2. That is, the first portion 310 may penetrate the gate structure and separate the first gate structure GS1 and the second gate structure GS2.

The second portion 320 of the separation structure 300 may be disposed between the first gate structure GS1 and the second gate structure GS2, as well as on the first gate structure GS1 and the second gate structure GS2. That is, the second portion 320 of the separation structure 300 may cover the upper surface of the first gate structure GS1 and the second gate structure GS2. In this case, the second portion 320 may serve as a capping layer covering the gate structure GS.

The first portion 310 and the second portion 320 of the separation structure 300 may be integrally formed. For example, the first portion 310 and the second portion 320 of the separation structure 300 may be formed of a same material. The first portion 310 and the second portion 320 of the separation structure 300 may include, for example, at least one of silicon nitride (SiN), silicon nitric oxide (SiON), silicon oxide ($SiO_2$), silicon carbonic nitride (SiOCN), silicon boron nitride (SiBN), silicon oxyboron nitride (SiOBN), or silicon oxycarbide (SiOC), or combinations thereof. The separation structure 300 may include a single membrane, but is not limited thereto. For example, the separation structure 300 may include multiple membranes.

Hereinafter, semiconductor devices according to some embodiment will be described with reference to FIG. 13, FIG. 14, FIG. 15, and FIG. 16.

Figure 13:
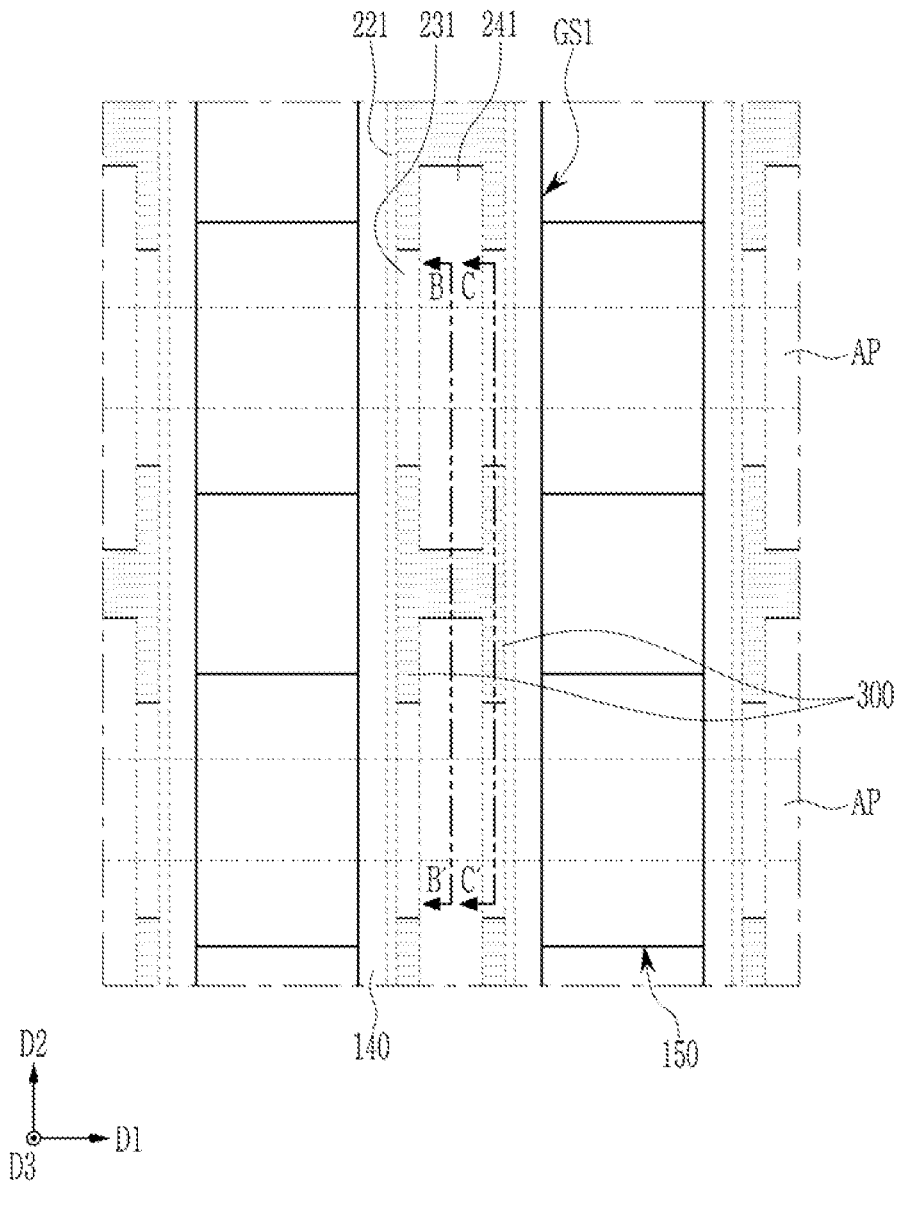
FIG. 13 is a top plan view illustrating a semiconductor device according to some embodiments.
Figure 14:
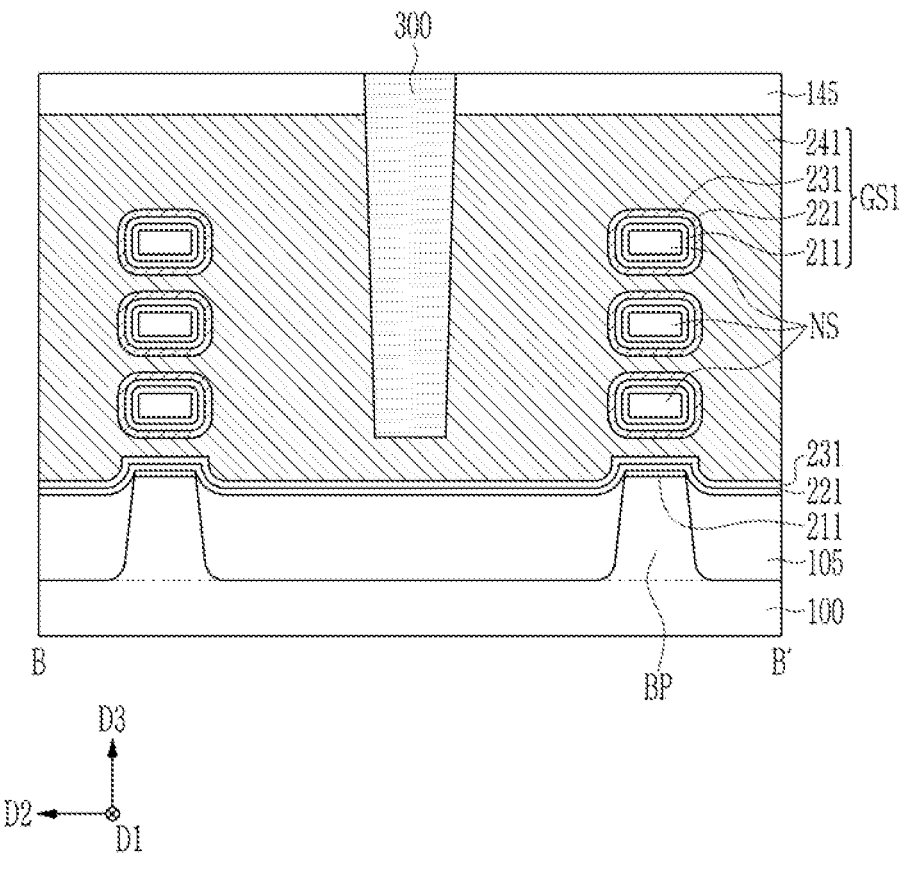
FIG. 14 is a cross-sectional view taken along line B-B' of FIG. 13.
Figure 15:
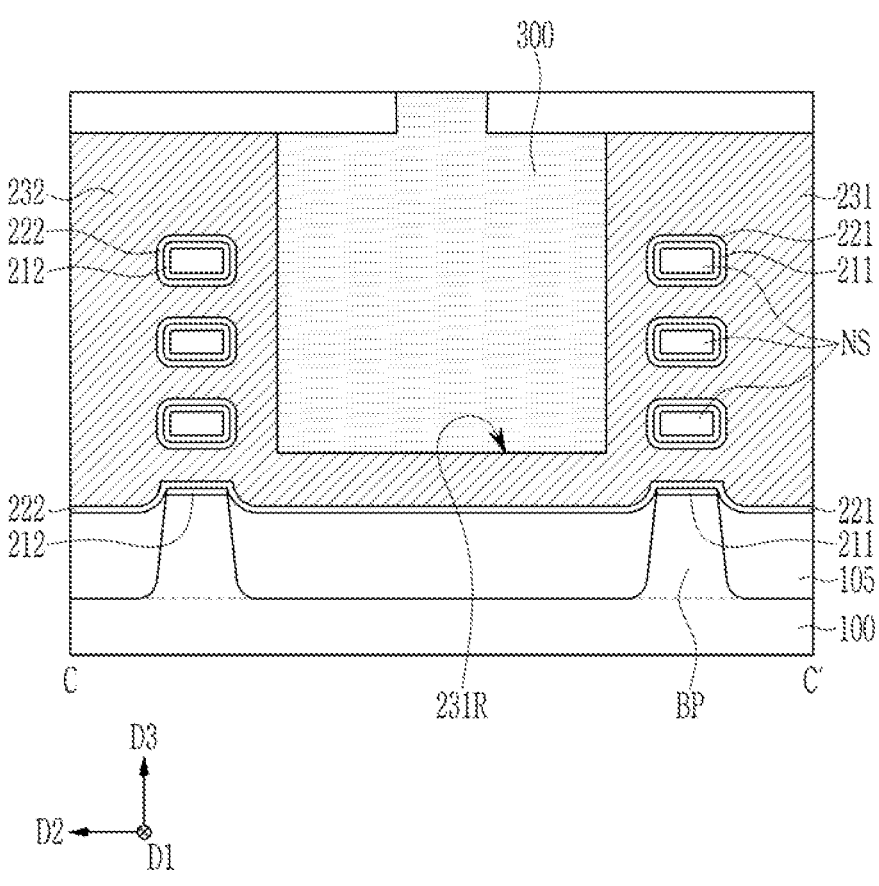
FIG. 15 is a cross-sectional view taken along line C-C' of FIG. 13.
Figure 16:
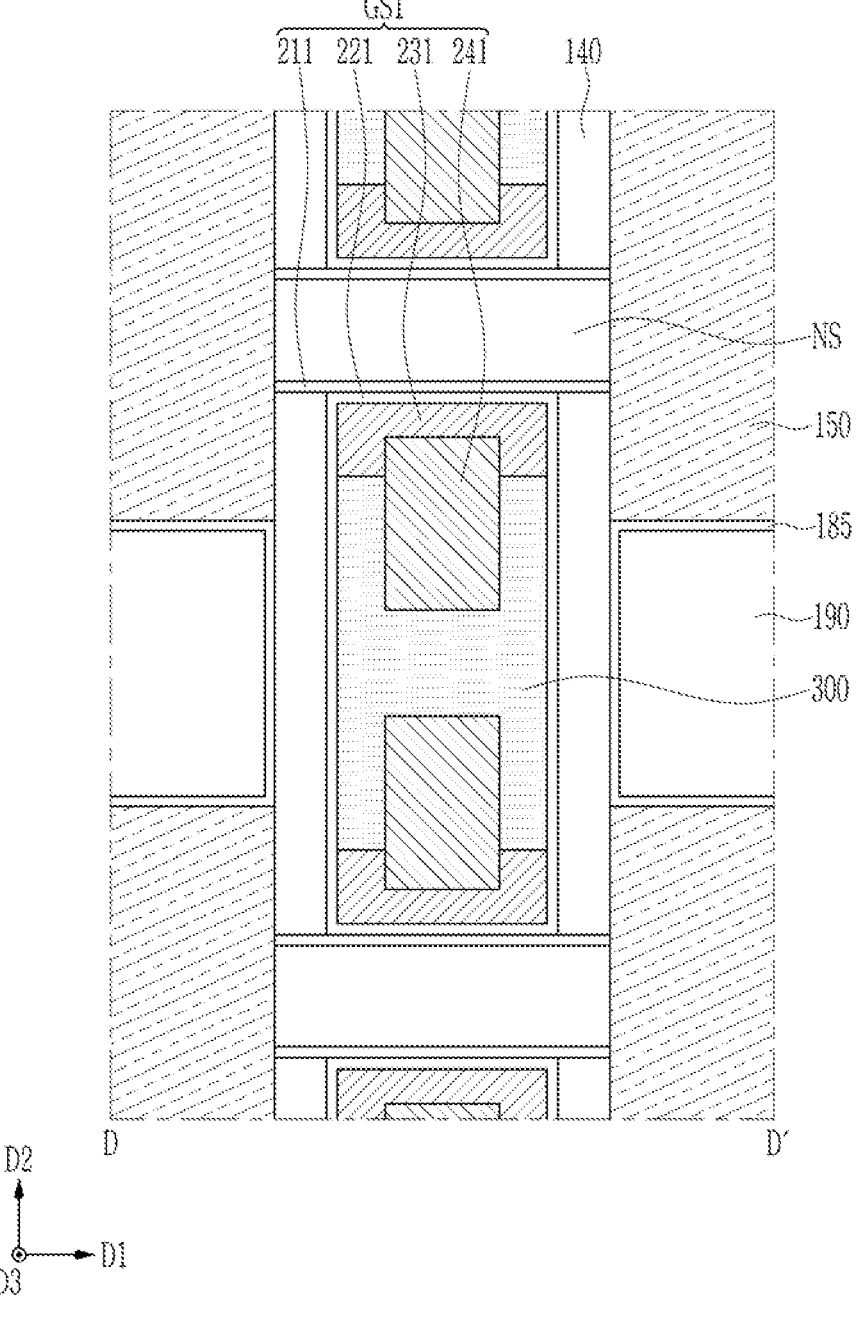
FIG. 16 is a cross-sectional view corresponding to D-D' of FIG. 2 illustrating the semiconductor device according to some embodiments.

FIG. 13 is a top plan view illustrating a semiconductor device according to some embodiments. FIG. 14 is a cross-sectional view taken along line B-B' of FIG. 13. FIG. 15 is a cross-sectional view taken along line C-C' of FIG. 13. FIG. 16 is a cross-sectional view corresponding to D-D' of FIG. 2 illustrating the semiconductor device according to some embodiments.

Since embodiments illustrated in FIGS. 13, FIG. 14, FIG. 15, and FIG. 16 have substantially the same in some parts as those illustrated in FIG. 1, FIG. 2, FIG. 3, FIG. 4, FIG. 5, and FIG. 6, a description thereof may be omitted. According to an embodiment the first portion 310 of the separation structure 300 is omitted, which will be described below.

The semiconductor device according to an embodiment may include a substrate 100, an active pattern AP, a plurality of gate structures GS, a source/drain pattern 150, a separation structure 300, a gate spacer 140, an etch stop layer 185, and an interlayer insulation layer 190.

In the foregoing embodiment, the separation structure 300 may include a first portion 310 extending in the first direction D1 and a second portion 320 protruding from the first portion 310 toward a channel pattern NS.

Further, the plurality of gate structures GS may include the first gate structure GS1 and the second gate structure GS2. The first gate structure GS1 and the second gate structure GS2 may each extend in the second direction D2. The first gate structure GS1 and the second gate structure GS2 may be spaced apart from each other in the second direction D2. The first gate structure GS1 and the second gate structure GS2 may be separated by the separation structure 300.

Referring to FIG. 13, FIG. 14, FIG. 15, and FIG. 16, the separation structure 300 of the semiconductor device according to some embodiments may be disposed on the first gate structure GS1. Specifically, the separation structure 300 may be disposed on a first conductive pattern 231 and a second conductive pattern 241. The separation structure 300 may be disposed within a recess 231R of the first conductive pattern 231. The separation structure 300 may fill the recess 231R of first conductive pattern 231. A bottom surface of the separation structure 300 may be in contact with each of the first conductive pattern 231 and the second conductive pattern 241. The bottom surface of the separation structure 300 may have a width greater than a width of a portion of the separation structure 300 penetrating the capping layer 145. The separation structure 300 may not penetrate the first gate structure GS1.

In a plan view, the separation structure 300 may be disposed between the gate spacers 140 adjacent in the first direction D1. At least a portion of the separation structure 300 may be disposed between the gate spacer 140 and the second conductive pattern 241. The remaining portion of the separation structure 300 may be disposed between the gate spacers 140 adjacent in the first direction D1. The separation structure 300 may overlap the second conductive pattern 241 in the first direction D1. At least a portion of a side surface of the separation structure 300 may be in contact with the second conductive pattern 241. The separation structure 300 may be disposed between the channel patterns NS adjacent in the second direction D2. However, the present disclosure is not limited thereto, and all of a side surface of the separation structure 300 of the semiconductor device according to some embodiments may overlap the second conductive pattern 241 in the first direction D1. That is, all of the side surface of the separation structure 300 may be in contact with the second conductive pattern 241.

Even when the separation structure 300 of the semiconductor device according to an embodiment does not include the first portion, the separation structure 300 may be located within the recess 231R of the first conductive pattern 231, so that portions of edges of the second conductive pattern 241 may be covered by the first conductive pattern 231, and the remaining portion may not be covered by the first conductive pattern 231. Additionally, the remaining portions of edges of the second conductive pattern 241 that are not covered by the first conductive pattern 231 may be covered by the separation structure 300. The separation structure 300 may be made of an insulating material, and may be a dielectric that is located between the second conductive pattern 241 and the source/drain pattern 150.

For the semiconductor device according to an embodiment, the parasitic capacitance between the conductive layer of the gate structure GS and the source/drain pattern 150 may be reduced compared to the capacitance that may occur when edges of the second conductive pattern 241 are entirely covered by the first conductive pattern 231. For example, the distance between the conductive layer of the gate structure GS and the source/drain pattern 150 may increase as the thickness of the dielectric disposed between the conductive layer of the gate structure GS and the source/drain pattern 150 is increased, and the parasitic capacitance between the conductive layer of the gate structure GS and the source/drain pattern 150 may be reduced. Due to the reduction of parasitic capacitance, the reliability of semiconductor devices may be improved.

Hereinafter, the semiconductor device according to some embodiment will be described with reference to FIG. 17, FIG. 18, FIG. 19, and FIG. 20.

Figure 17:
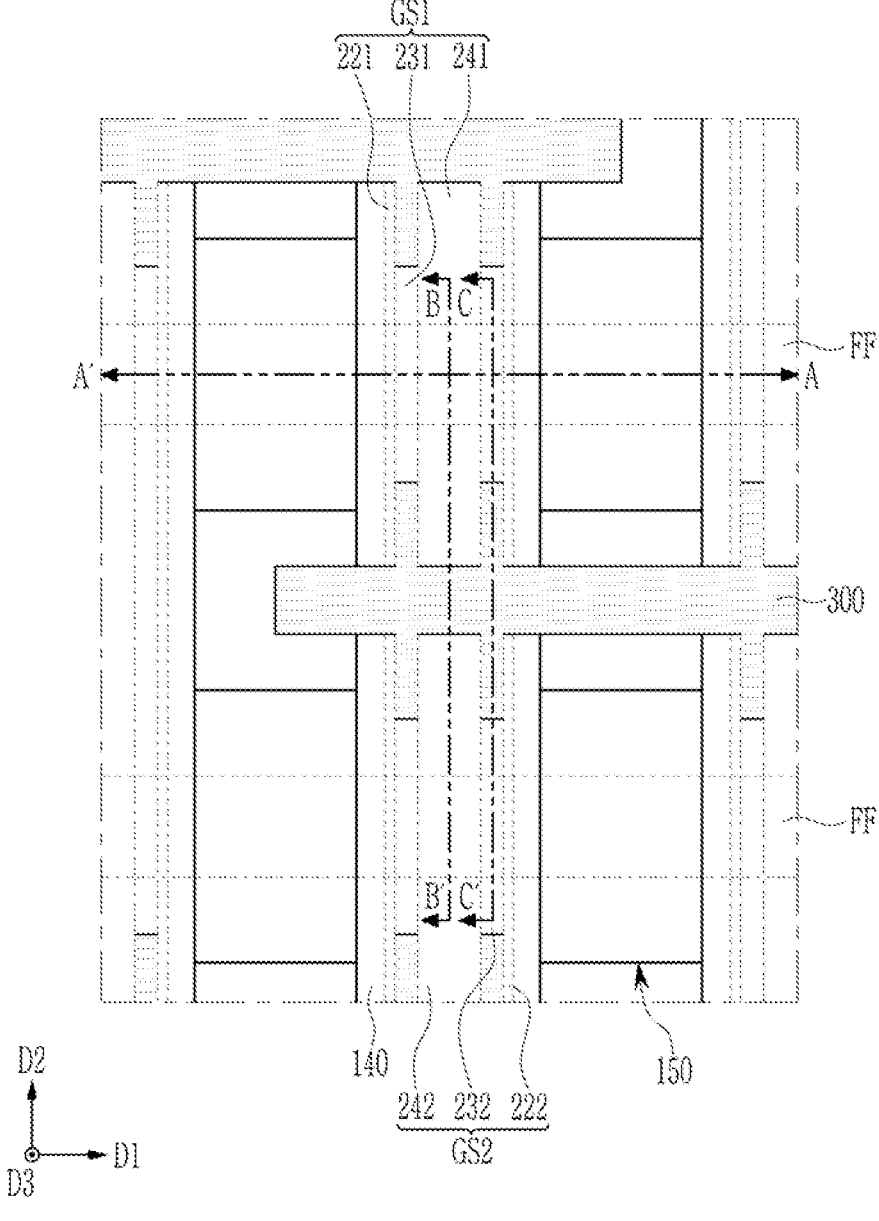
FIG. 17 is a top plan view illustrating a semiconductor device according to some embodiments.
Figure 18:
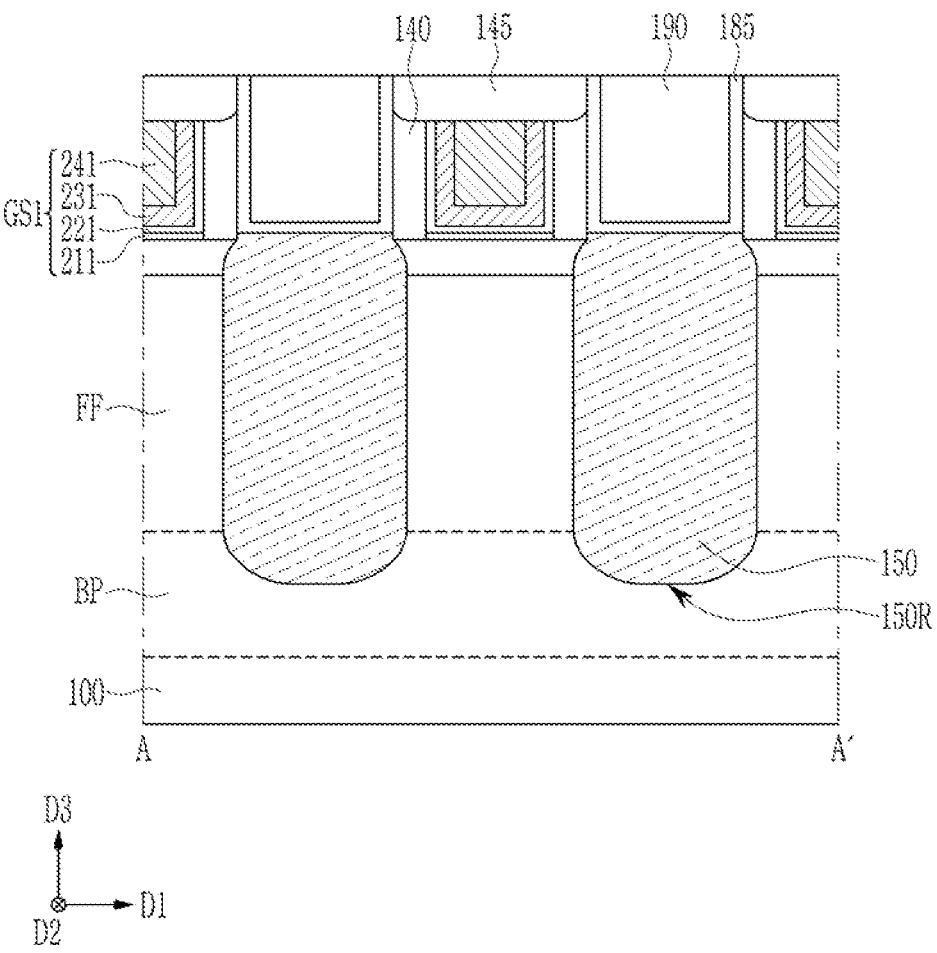
FIG. 18 is a cross-sectional view taken along line A-A' of FIG. 17.
Figure 19:
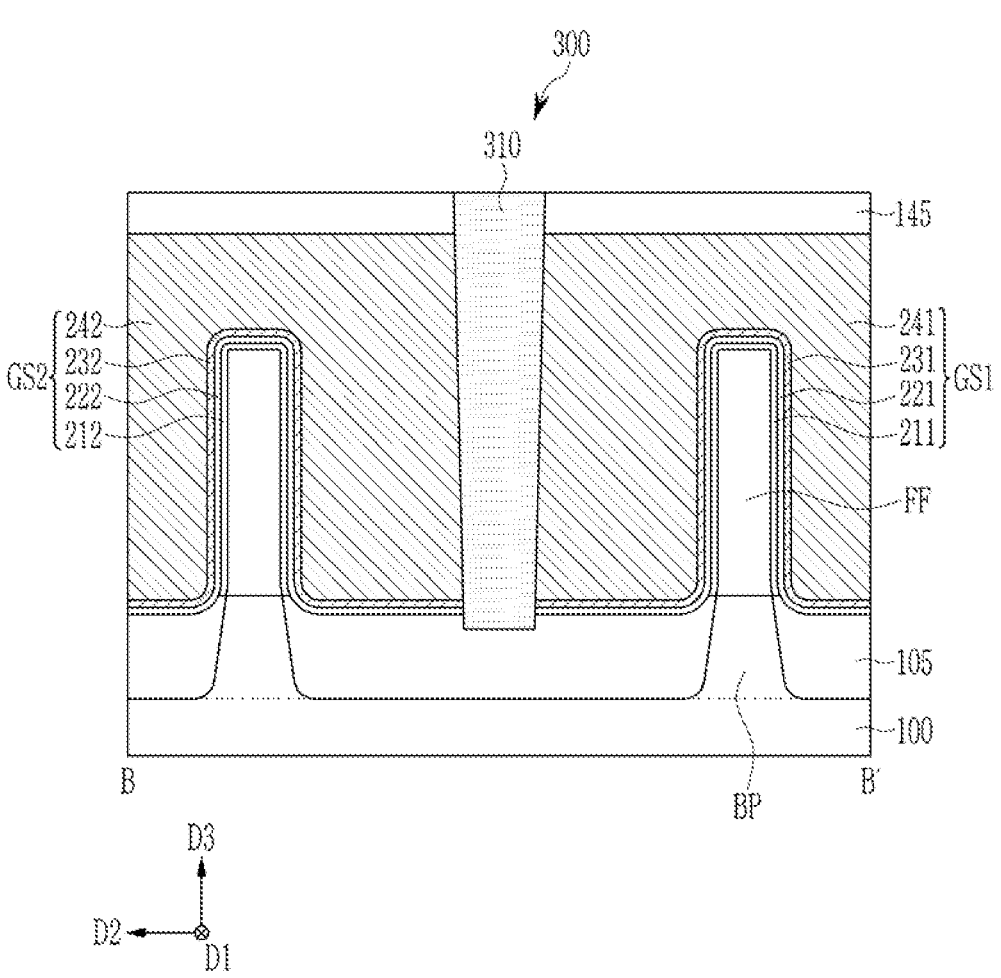
FIG. 19 is a cross-sectional view taken along line B-B' of FIG. 17.
Figure 20:
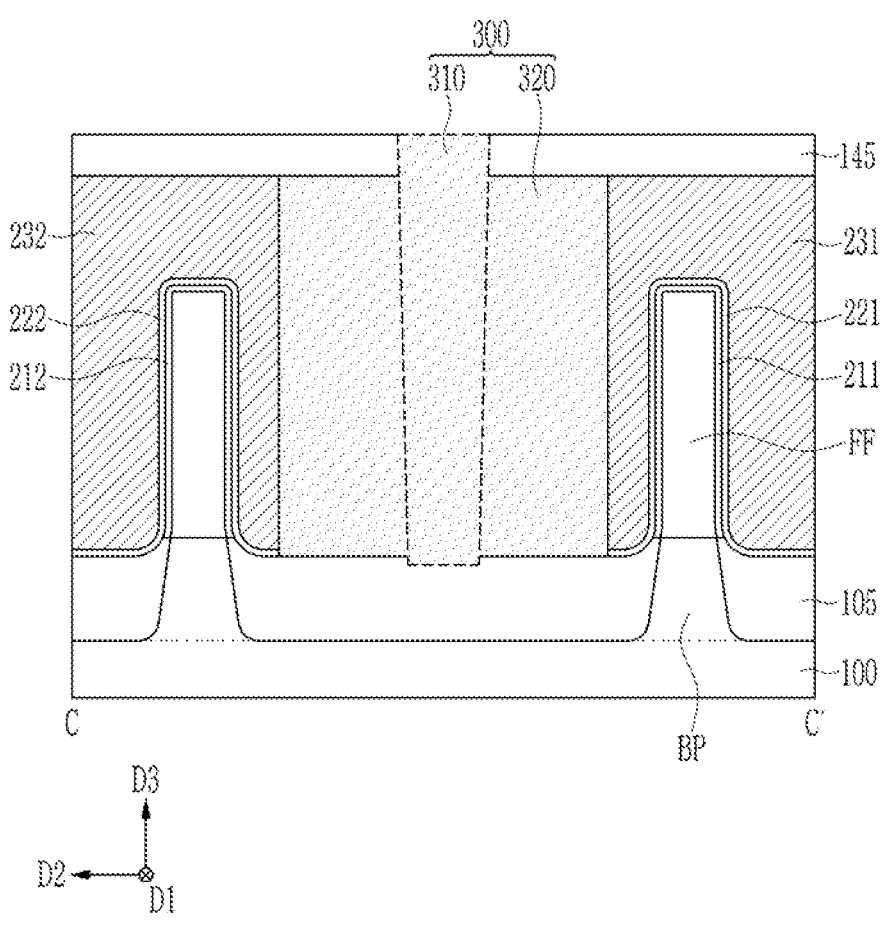
FIG. 20 is a cross-sectional view taken along line C-C' of FIG. 17.

FIG. 17 is a top plan view illustrating a semiconductor device according to some embodiments. FIG. 18 is a cross-sectional view taken along line A-A' of FIG. 17. FIG. 19 is a cross-sectional view taken along line B-B' of FIG. 17. FIG. 20 is a cross-sectional view taken along line C-C' of FIG. 17.

Since embodiments illustrated in FIG. 17, FIG. 18, FIG. 19, and FIG. 20 have substantially the same in some parts as those illustrated in FIG. 1, FIG. 2, FIG. 3, FIG. 4, FIG. 5, and FIG. 6, a description thereof may be omitted. In an embodiment the semiconductor device may include a fin pattern FF, which will be described below.

The semiconductor device according to an embodiment may include a substrate 100, a lower pattern BP, a fin pattern FF, a plurality of gate structures GS, a source/drain pattern 150, a separation structure 300, a gate spacer 140, an etch stop layer 185, and an interlayer insulation layer 190

In an embodiment, the plurality of channel patterns NS may be disposed on an upper surface of the lower pattern BP. In addition, the gate structure GS may surround each channel pattern (NS). For example, at least a portion of the gate structure GS may be disposed on a stacked structure of the gate structure GS and the channel pattern NS. Other portions of the first conductive pattern 231 may cover side surfaces of the stacked structure of the gate structure GS and the channel pattern NS. In this case, the four sides of the channel pattern NS may be surrounded by a gate structure GS.

Referring to FIG. 17, FIG. 18, FIG. 19, and FIG. 20, the active pattern AP of the semiconductor device according to some embodiments includes the lower pattern BP and the fin pattern FF.

The fin pattern FF may be located on the lower pattern BP. The fin pattern FF may protrude along the third direction D3 from the upper surface of the lower pattern BP.

The gate structure GS may extend in the second direction D2 across the fin pattern FF. The gate structure GS may vertically overlap the fin pattern FF.

The gate structure GS may surround the upper surface and sidewalls of the fin pattern FF.

The gate structure GS, the fin pattern FF, and the source/drain pattern 150 according to an embodiment may be a three-dimensional field effect transistor (for example, Fin-FET) in which the gate structure GS surrounds the fin pattern FF in three dimensions.

Hereinafter, a method of manufacturing a semiconductor device according to an embodiment will be described with reference to FIG. 21, FIG. 22, FIG. 23, and FIG. 24.

FIG. 21, FIG. 22, FIG. 23, and FIG. 24 are cross-sectional views corresponding to C-C' of FIG. 1 illustrating intermediate operations of a method of manufacturing a semiconductor device according to an embodiment.

Figure 21:
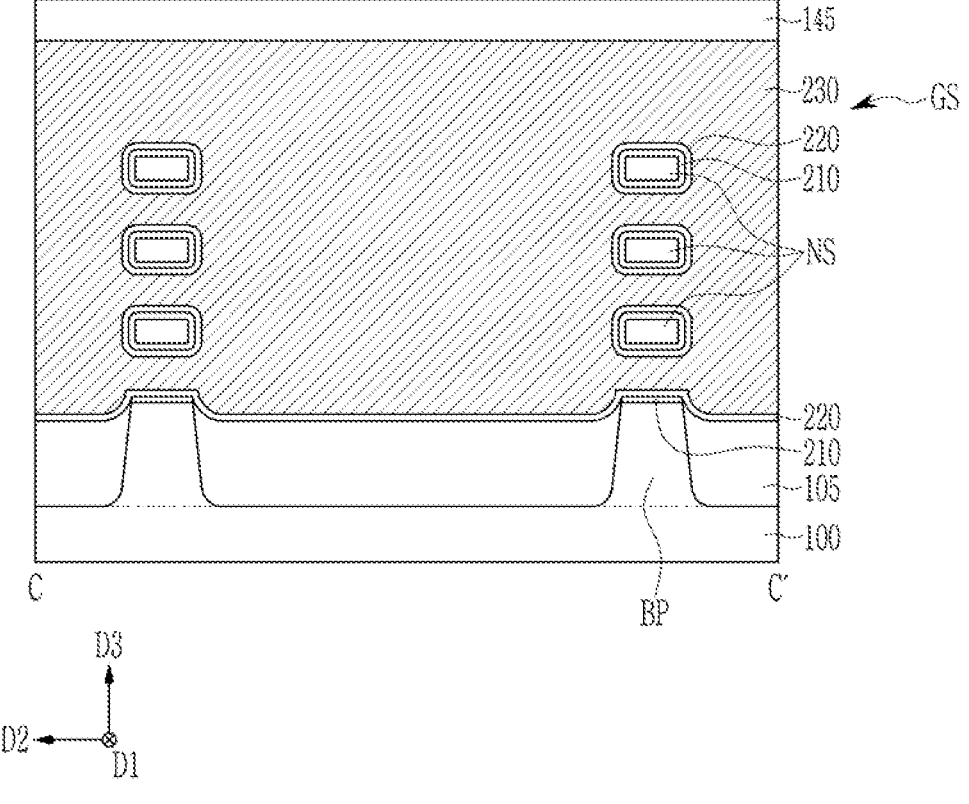
FIG. 21, FIG. 22, FIG. 23, and FIG. 24 are cross-sectional views corresponding to C-C' of FIG. 1 illustrating intermediate operations of a method of manufacturing a semiconductor device according to an embodiment.

As illustrated in FIG. 21, a method of manufacturing a semiconductor device according to an embodiment may include forming an active pattern AP, a channel pattern NS, a field insulation layer 105, a gate structure GS, a source/drain pattern 150, a capping layer 145, and an interlayer insulation layer 190 on a substrate 100.

The substrate 100 may be silicon-on-insulator (SOI) or bulk silicon. Alternatively, the substrate 100 may be a silicon substrate or may include other materials, such as, but not limited to, silicon germanium (SiGe), silicon germanium on insulator (SGOI), indium antimonide, lead telluride compounds, indium arsenide, indium phosphide, gallium arsenide, or gallium antimonide.

A lower pattern BP may be formed on the substrate 100. The lower pattern BP may be formed by patterning an upper portion of the substrate 100. A gate sacrifice pattern and the channel pattern NS may be formed on the lower pattern BP, and the source/drain pattern 150 may be formed on sides of the gate sacrifice pattern and the channel pattern NS. For example, the source/drain pattern 150 is formed on both sides of the gate sacrifice pattern and the channel pattern NS. The source/drain pattern 150 may be formed by using an epitaxial growth method. The source/drain pattern 150 may include silicon germanium (SiGe). However, the present disclosure is not limited thereto, and the material of the source/drain pattern 150 may be variously changed. The interlayer insulation layer 190 may be formed to cover the source/drain pattern 150.

The gate sacrificial pattern may be removed, and the gate structure GS may be formed within the space where the gate sacrificial pattern has been removed. The gate insulation layer 210, the gate dielectric layer 220, and the conductive pattern 230 may be formed sequentially from the channel pattern NS. For example, the gate insulation layer 210 may be formed on the channel pattern NS, the gate dielectric layer 220 may be formed on the gate insulation layer 210, and the conductive pattern 230 may be formed on the gate dielectric layer 220. The gate electrode may be formed by using an atomic layer deposition (ALD) process, a chemical vapor deposition (CVD) process, or the like.

Accordingly, the gate structure GS may cover the upper surface of the channel pattern NS, and may cover side surfaces of the channel pattern NS. The source/drain patterns 150 may be disposed on side of the gate structure GS. Next, a capping layer 145 may be formed on the gate structure GS.

Figure 22:
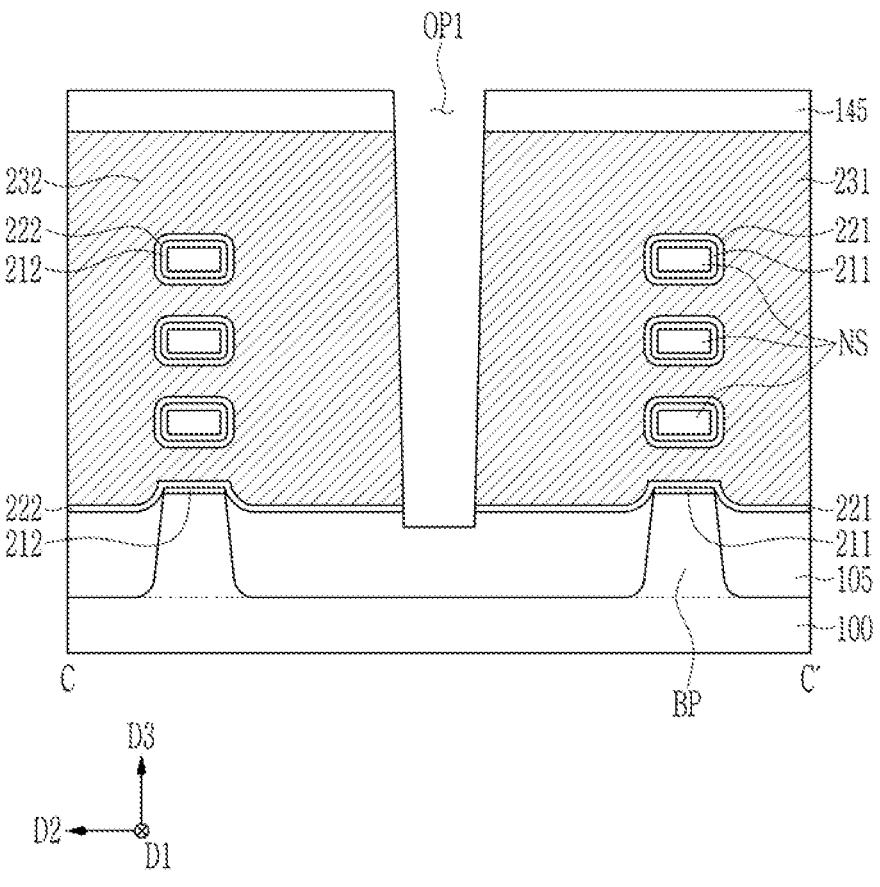

As illustrated in FIG. 22, an etching process may be performed to remove portions of the capping layer 145 and the gate structure GS to form a first open portion OP1.

An etching process may be performed to remove portions of the capping layer 145 and the gate structure GS. For example, portions of the conductive patterns of the gate structure GS, the gate dielectric layer, and the gate insulation layer may be removed. The etching process may be accomplished by, for example, dry etching or wet etching, but is not limited to. In the process of etching the portion of the gate structure GS, the etching process may be performed by using an etchant having a relatively high etch rate for the interlayer insulation layer 190.

As the portion of the gate structure GS is removed, the first open portion OP1 extending in the first direction D1 may be formed. As the first open portion OP1 is formed, the first gate structure GS1 and the second gate structure GS2 may be separated. Further, as the first open portion OP1 is formed, the first conductive pattern 231 and a third conductive pattern 232 may be exposed.

In this case, in the process of forming the first open portion OP1, a portion of the field insulation layer 105 may be etched together. Thus, the field insulation layer 105 may be exposed. Thus, the first open portion OP1 may penetrate the gate structure to be recessed in the field insulation layer 105, but is not limited thereto.

Figure 23:
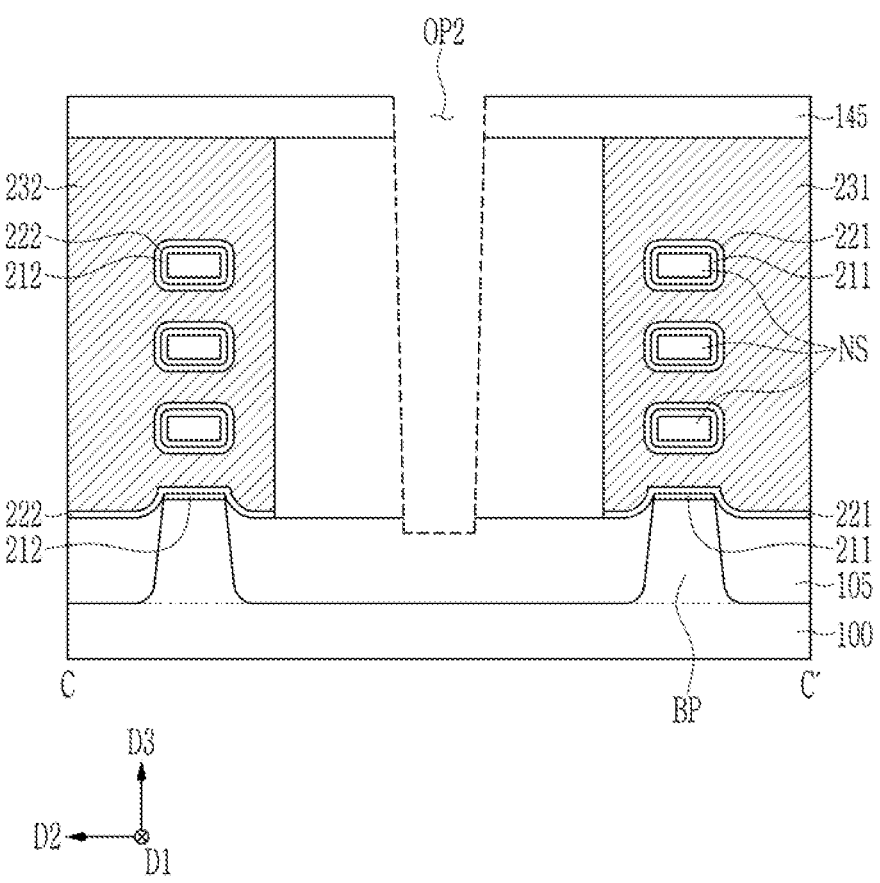

As illustrated in FIG. 23, an etch process may be performed to remove portions of the first conductive pattern 231 and the third conductive pattern 232 to form a second open portion OP2.

Portions of the first conductive pattern 231 and the third conductive pattern 232 may be removed by performing the etching process. The etching process may be accomplished by, for example, wet etching, but is not limited to. In the process of etching the portions of the first conductive pattern 231 and the third conductive pattern 232, the etching process may be performed by using an etchant having a relatively high etch rate for the second conductive pattern 241 and the fourth conductive pattern 242. Furthermore, the process of etching the portions of the first conductive pattern 231 and the third conductive pattern 232 may be performed by using an etchant having a relatively high etch rate for the field insulation layer 105 and the capping layer 145.

The etching process may, for example, remove a portion of the first conductive pattern 231 of the first gate structure GS1 and may not remove the second conductive pattern 241. Additionally, a portion of the third conductive pattern 232 of the second gate structure GS2 may be removed, and the fourth conductive pattern 242 may not be removed. Thus, as the second open portion OP2 is formed by removing the portions of the first conductive pattern 231 and the third conductive pattern 232, the length of the first conductive pattern 231 along the second direction D2 may be shorter than the length of the second conductive pattern 241 along the second direction D2. Further, the length along the second direction D2 of the third conductive pattern 232 may be shorter than the length along the second direction D2 of the fourth conductive pattern 242.

In this case, the portion of the first gate dielectric layer 221 exposed by the second open portion OP2 may be removed together. For example, a portion of a top surface of the field insulation layer 105 may be exposed by the second open portion OP2.

Figure 24:
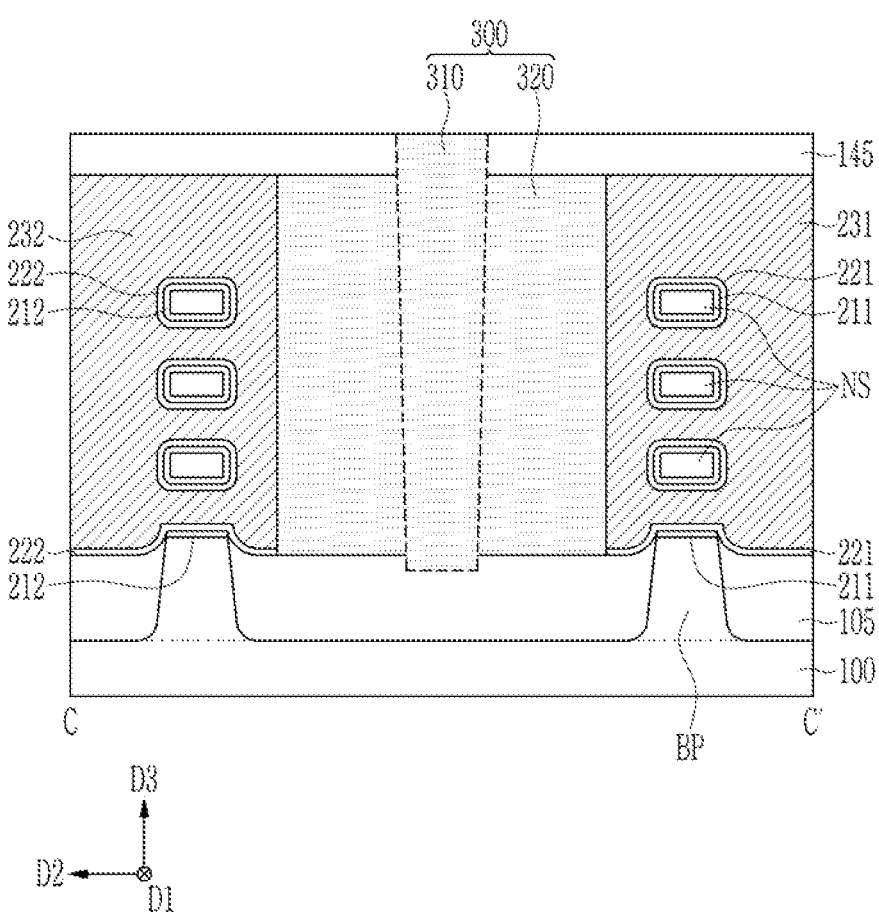

As illustrated in FIG. 24, a separation structure 300 may be formed within the second open portion OP2 to form the semiconductor device of FIG. 2. For example, the separation structure 300 may fill the second open portion OP2 of FIG. 23.

Although embodiments of the present invention have been described in detail, the scope of the present invention is not limited thereto. Various changes and modifications using the basic concept of the present invention defined in the accompanying claims by those skilled in the art shall be construed to belong to the scope of the present invention.

DESCRIPTION OF SYMBOLS

100: Substrate
105: Field insulation layer
AP: Active pattern
NS: Sheet pattern
150: Source/drain pattern
GS1: First gate structure
GS2: Second gate structure
231: First conductive pattern
241: Second conductive pattern
211: First gate insulation layer
221: first gate dielectric layer
300: Separation structure
310: First portion
320: Second portion

What is claimed is:

1. A semiconductor device, comprising:
a substrate;
a lower pattern extending from the substrate in a first direction;
a channel pattern disposed on the lower pattern;
a source/drain pattern disposed on sides of the channel pattern;
a first gate structure and a second gate structure extending in a second direction intersecting the first direction and surrounding respective portions of the channel pattern; and
a separation structure disposed between the first gate structure and the second gate structure, and including a first portion extending in the first direction and a second portion protruding from the first portion toward the channel pattern,
wherein the first gate structure includes a first conductive pattern and a second conductive pattern stacked sequentially from the respective portion of the channel pattern, and a length of the second conductive pattern in the second direction is equal to or greater than a length of the second portion of the separation structure in the second direction.

2. The semiconductor device of claim 1, wherein the first conductive pattern is spaced apart from the first portion of the separation structure.

3. The semiconductor device of claim 2, wherein a length in the second direction between the first portion of the separation structure and the first conductive pattern is shorter than a length in the second direction between the first portion of the separation structure and the channel pattern.

4. The semiconductor device of claim 1, wherein a length of the first conductive pattern in the second direction is shorter than a length in the second direction between the channel pattern and the first portion of the separation structure.

5. The semiconductor device of claim 1, wherein the second portion of the separation structure is located between the first conductive pattern and the first portion of the separation structure.

6. The semiconductor device of claim 5, wherein at least a portion of a side surface of the second conductive pattern overlaps the second portion of the separation structure in the first direction.

7. The semiconductor device of claim 1, wherein the second gate structure includes a third conductive pattern and a fourth conductive pattern stacked sequentially from the respective portion of the channel pattern, and
a distance between the first conductive pattern and the third conductive pattern is greater than a distance between the second conductive pattern and the fourth conductive pattern.

8. The semiconductor device of claim 1, wherein in a plan view, the first conductive pattern surrounds at least a portion of the second conductive pattern.

9. The semiconductor device of claim 8, wherein the first conductive pattern comprises a protrusion that overlaps at least a portion of the second conductive pattern in the first direction.

10. The semiconductor device of claim 1, further comprising a gate spacer located between the source/drain pattern and the first gate structure,
wherein the second portion of the separation structure is disposed between the gate spacer and the second conductive pattern.

11. The semiconductor device of claim 10, wherein the first gate structure further includes a gate dielectric layer interposed between the first conductive pattern and the channel pattern, and between the first conductive pattern and the gate spacer.

12. The semiconductor device of claim 11, wherein the gate dielectric layer extends along a side surface of the second portion of the separation structure.

13. The semiconductor device of claim 11, further comprising a field insulation layer located on a side surface of the lower pattern,
wherein the first portion of the separation structure is located on the field insulation layer, and the second portion of the separation structure is located on the second conductive pattern.

14. A semiconductor device, comprising:
a substrate;
a lower pattern disposed on the substrate and extending in a first direction;
a channel pattern disposed on the lower pattern;

a source/drain pattern disposed on sides of the channel pattern; and a first gate structure and a second gate structure extending in a second direction intersecting the first direction and surrounding respective portions of the channel pattern, wherein the first gate structure includes a first conductive pattern and a second conductive pattern stacked sequentially from the respective portion of the channel pattern, the second gate structure includes a third conductive pattern and a fourth conductive pattern stacked sequentially from the respective portion of the channel pattern, and a distance between the first conductive pattern and the third conductive pattern is greater than a distance between the second conductive pattern and the fourth conductive pattern.

15. The semiconductor device of claim 14, further comprising a gate spacer located between the source/drain pattern and the first gate structure, wherein at least a portion of the first conductive pattern is disposed between the gate spacer and the second conductive pattern.

16. The semiconductor device of claim 15, wherein at least a portion of the first conductive pattern overlaps the second conductive pattern in the first direction.

17. The semiconductor device of claim 15, wherein the first gate structure further includes a gate dielectric layer interposed between the first conductive pattern and the channel pattern, and between the first conductive pattern and the gate spacer.

18. The semiconductor device of claim 17, wherein the gate dielectric layer extends along a side surface of the gate spacer.

19. A semiconductor device, comprising:

a substrate;

a lower pattern disposed on the substrate and extending in a first direction;

a channel pattern disposed on the lower pattern;

a source/drain pattern disposed on sides of the channel pattern; and a first gate structure extending in a second direction intersecting the first direction and surrounding respective portions of the channel pattern, wherein the first gate structure includes a first conductive pattern and a second conductive pattern stacked sequentially from the channel pattern, a separation structure interposed within a recess of the first conductive pattern, and at least a portion of the second conductive pattern is surrounded by the separation structure.

20. The semiconductor device of claim 19, further comprising a field insulation layer located on a side surface of the lower pattern, wherein the separation structure is located on the field insulation layer.

* * * * *